US012610691B2

(12) United States Patent
Kim et al.

(10) Patent No.: US 12,610,691 B2
(45) Date of Patent: Apr. 21, 2026

(54) DISPLAY APPARATUS

(71) Applicant: Samsung Display Co., Ltd., Yongin-si (KR)

(72) Inventors: Haemin Kim, Yongin-si (KR);
Bonyong Koo, Yongin-si (KR);
Myunghoon Park, Yongin-si (KR);
Byungchang Yu, Yongin-si (KR);
Donghoon Lee, Yongin-si (KR);
Kyunghoon Chung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 434 days.

(21) Appl. No.: 18/179,969

(22) Filed: Mar. 7, 2023

(65) Prior Publication Data

US 2023/0363206 A1     Nov. 9, 2023

(30) Foreign Application Priority Data

May 9, 2022     (KR) ........................ 10-2022-0056883

(51) Int. Cl.
H10K 59/121     (2023.01)
G09G 3/3241     (2016.01)
(Continued)

(52) U.S. Cl.
CPC ..... H10K 59/1216 (2023.02); H10K 59/1213 (2023.02); H10K 59/123 (2023.02);
(Continued)

(58) Field of Classification Search
CPC ............. H10K 59/1213; H10K 59/123; H10K 59/124; H10K 59/131; H10K 59/805; H10K 50/805; H10K 59/12; H10K 59/1315; G09G 3/3241; G09G 2300/0426; G09G 2300/0852; G09G 2310/08; G09G 3/3233; G09G 2300/0819; G09G 2300/0861; G09G 2300/0876; G09G 2310/0251;
(Continued)

(56) References Cited

U.S. PATENT DOCUMENTS 10,176,758 B2     1/2019   Nie
10,236,330 B2     3/2019   Maruyama
(Continued)

FOREIGN PATENT DOCUMENTS

CN          106504700 B     3/2018
JP            6673731 B2     3/2020
(Continued)

*Primary Examiner* — Chad M Dicke
*Assistant Examiner* — Gary Abel
(74) *Attorney, Agent, or Firm* — Womble Bond Dickinson (US) LLP

(57)     ABSTRACT

A display apparatus includes a first capacitor electrode, a second capacitor electrode over the first capacitor electrode and overlapping the first capacitor electrode, a power voltage line over the second capacitor electrode and electrically connected to the second capacitor electrode, a connection electrode at a same layer as the power voltage line, the connection electrode being electrically connected to the first (Continued)

capacitor electrode, and a pixel electrode over the connection electrode and electrically connected to the connection electrode. A high-quality image may be displayed on the display apparatus.

21 Claims, 20 Drawing Sheets

(51) Int. Cl.
*H10K 59/123* (2023.01)
*H10K 59/124* (2023.01)
*H10K 59/131* (2023.01)

(52) U.S. Cl.
CPC ......... *H10K 59/124* (2023.02); *H10K 59/131* (2023.02); *G09G 3/3241* (2013.01); *G09G 2300/0426* (2013.01); *G09G 2300/0852* (2013.01); *G09G 2310/08* (2013.01)

(58) Field of Classification Search
CPC ...... H10D 30/6755; H01L 2924/14369; H01L 2924/14367; H01L 2924/14368; H01L 2924/14364; H01L 2924/14365; H01L 2924/14366; H01L 2924/1436; H10B 12/10; H10B 12/00; H10B 12/20
See application file for complete search history.

(56) References Cited

U.S. PATENT DOCUMENTS

| | | | |
|---|---|---|---|
| 2005/0041167 A1* | 2/2005 | Sugimoto | G02F 1/136227 |
| | | | 349/43 |
| 2006/0108916 A1* | 5/2006 | Koo | H10D 86/60 |
| | | | 257/E27.111 |
| 2015/0187823 A1* | 7/2015 | Miyairi | H10D 86/423 |
| | | | 257/43 |
| 2019/0088200 A1* | 3/2019 | Woo | H10K 59/352 |
| 2019/0189942 A1* | 6/2019 | Ikeda | H10D 64/66 |
| 2020/0135120 A1* | 4/2020 | Seo | H10K 59/124 |
| 2021/0151475 A1 | 5/2021 | Kim et al. | |
| 2021/0384229 A1 | 12/2021 | Lee et al. | |
| 2023/0217739 A1* | 7/2023 | Lee | H10K 59/126 |
| | | | 257/40 |
| 2024/0013715 A1* | 1/2024 | Li | G09G 3/32 |

FOREIGN PATENT DOCUMENTS

| | | |
|---|---|---|
| KR | 10-2218725 B1 | 2/2021 |
| KR | 10-2021-0062129 A | 5/2021 |
| KR | 10-2259805 B1 | 6/2021 |
| KR | 10-2021-0085731 A | 7/2021 |
| KR | 10-2021-0152101 A | 12/2021 |

* cited by examiner

DISPLAY APPARATUS

CROSS-REFERENCE TO RELATED APPLICATION

This application claims priority to and the benefit of Korean Patent Application No. 10-2022-0056883, filed on May 9, 2022, in the Korean Intellectual Property Office, the entire disclosure of which is incorporated by reference herein.

BACKGROUND

1. Field

One or more embodiments relate to a display apparatus, and more particularly, to a display apparatus in which a high-quality image may be displayed.

2. Description of the Related Art

An organic light-emitting display apparatus includes an organic light-emitting device as a display device. The organic light-emitting device includes a pixel electrode, an opposite electrode, and an intermediate layer interposed between the pixel electrode and the opposite electrode and including an emission layer. In addition, the organic light-emitting display apparatus includes a thin-film transistor, a capacitor, and/or a line configured to control an electrical signal applied to the organic light-emitting device.

SUMMARY

A display apparatus of the related art may not display a high-quality image due to the insufficient capacity of a capacitor.

One or more embodiments of the present disclosure include a display apparatus in which a high-quality image may be displayed. However, this is merely an example, and the scope of embodiments is not limited thereto.

Additional aspects will be set forth in part in the description which follows and, in part, will be apparent from the description, or may be learned by practice of the embodiments of the present disclosure.

According to one or more embodiments, a display apparatus includes a first capacitor electrode, a second capacitor electrode over the first capacitor electrode and overlapping the first capacitor electrode, a power voltage line over the second capacitor electrode and electrically connected to the second capacitor electrode, a connection electrode at a same layer as the power voltage line, the connection electrode being electrically connected to the first capacitor electrode, and a pixel electrode over the connection electrode and electrically connected to the connection electrode.

The display apparatus may further include a semiconductor layer on an insulating layer covering the second capacitor electrode, and a gate electrode over the semiconductor layer, wherein the power voltage line and the connection electrode may be on an insulating layer covering the gate electrode.

The semiconductor layer may include an oxide semiconductor.

The connection electrode may be electrically connected to the gate electrode and the semiconductor layer.

The display apparatus may further include a third capacitor electrode over the first capacitor electrode overlapping the first capacitor electrode and at a same layer as the second capacitor electrode, third capacitor electrode being spaced from the second capacitor electrode.

The display apparatus may further include a fourth capacitor electrode over the second capacitor electrode overlapping the second capacitor electrode and electrically connected to the connection electrode.

The display apparatus may further include a semiconductor layer on an insulating layer covering the second capacitor electrode, and a gate electrode over the semiconductor layer, wherein the power voltage line and the connection electrode may be on an insulating layer covering the gate electrode, and the fourth capacitor electrode and the semiconductor layer may be integrally formed as a single body.

The semiconductor layer may include an oxide semiconductor.

The display apparatus may further include a fourth capacitor electrode interposed between the second capacitor electrode and the power voltage line and electrically connected to the connection electrode, wherein a portion of the fourth capacitor electrode may overlap the second capacitor electrode and another portion of the fourth capacitor electrode may overlap the power voltage line.

The display apparatus may further include a semiconductor layer on an insulating layer covering the second capacitor electrode, and a gate electrode over the semiconductor layer, wherein the power voltage line and the connection electrode may be on an insulating layer covering the gate electrode, and the fourth capacitor electrode and the semiconductor layer may be integrally formed as a single body.

The semiconductor layer may include an oxide semiconductor.

According to one or more embodiments, a display apparatus includes a first capacitor electrode, a third capacitor electrode over the first capacitor electrode and overlapping the first capacitor electrode, a semiconductor layer on an insulating layer covering the third capacitor electrode, a fourth capacitor electrode at a same layer as the semiconductor layer, the fourth capacitor electrode being spaced from the semiconductor layer and overlapping the first capacitor electrode, a power voltage line over the fourth capacitor electrode and electrically connected to the fourth capacitor electrode, a connection electrode at a same layer as the power voltage line, the connection electrode being electrically connected to the first capacitor electrode, and a pixel electrode over the connection electrode and electrically connected to the connection electrode.

The fourth capacitor electrode may include a same material as a material of the semiconductor layer.

Each of the semiconductor layer and the fourth capacitor electrode may include an oxide semiconductor.

The display apparatus may further include a gate electrode over the semiconductor layer, wherein the power voltage line and the connection electrode may be on an insulating layer covering the gate electrode.

The connection electrode may be electrically connected to the gate electrode and the semiconductor layer.

According to one or more embodiments, a display apparatus includes a first capacitor electrode, a third capacitor electrode over the first capacitor electrode to overlap the first capacitor electrode, a second capacitor electrode on a layer on which the third capacitor electrode is disposed, the second capacitor electrode being spaced from the third capacitor electrode, a semiconductor layer on an insulating layer covering the third capacitor electrode, a fourth capacitor electrode at a same layer as the semiconductor layer, the fourth capacitor electrode being spaced from the semiconductor layer and overlapping the second capacitor electrode, a power voltage line over the fourth capacitor electrode and electrically connected to the fourth capacitor electrode, a connection electrode at a same layer as the power voltage line, the connection electrode being electrically connected to the first capacitor electrode, and a pixel electrode over the connection electrode and electrically connected to the connection electrode.

The fourth capacitor electrode may include a same material as a material of the semiconductor layer.

Each of the semiconductor layer and the fourth capacitor electrode may include an oxide semiconductor.

The display apparatus may further include a gate electrode over the semiconductor layer, wherein the power voltage line and the connection electrode may be on an insulating layer covering the gate electrode.

The connection electrode may be electrically connected to the gate electrode and the semiconductor layer.

These and/or other aspects will become apparent and more readily appreciated from the following description of the embodiments, the claims, and the accompanying drawings.

BRIEF DESCRIPTION OF THE DRAWINGS

The above and other aspects, features, and advantages of embodiments of the present disclosure will be more apparent from the following description taken in conjunction with the accompanying drawings, in which.

DETAILED DESCRIPTION

Figure 1:
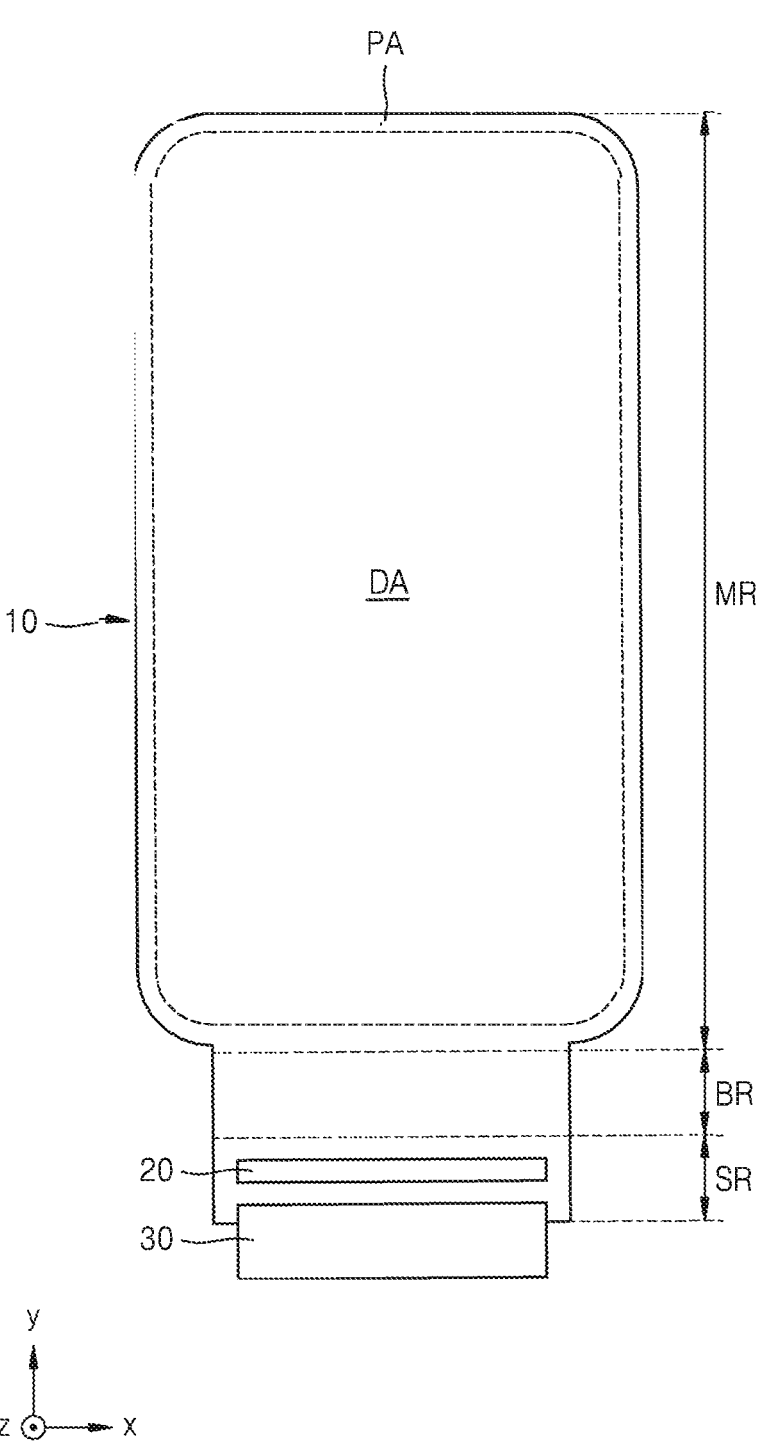
FIG. 1 is a plan view schematically illustrating a portion of a display apparatus according to one or more embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the present disclosure, the expression "at least one of a, b, or c" indicates only a, only b, only c, both a and b, both a and c, both b and c, all of a, b, and c, or variations thereof.

As the present disclosure allows for various changes and numerous embodiments, certain embodiments will be illustrated in the drawings and described in detail in the written description. Effects and features of the disclosure, and methods of achieving them will become apparent with reference to the embodiments described below in detail in conjunction with the drawings. However, the present disclosure is not limited to the embodiments disclosed below, and may be implemented in various forms.

Hereinafter, embodiments of the present disclosure will be described in detail with reference to the accompanying drawings. When describing embodiments with reference to the drawings, the same or corresponding components are denoted by the same reference numerals, and redundant descriptions thereof are omitted.

It will be understood that when a component, such as a layer, a film, a region, or a plate, is referred to as being "on" another component, the component can be directly on the other component or intervening components may be present therebetween. Sizes of components in the drawings may be exaggerated or reduced for convenience of explanation. For example, because sizes and thicknesses of components in the drawings are arbitrarily illustrated for convenience of explanation, the present disclosure is not limited thereto.

In the following embodiments, the x-axis, y-axis, and z-axis are not limited to three axes on a Cartesian coordinate system, and may be interpreted in a broad sense including them. For example, the x-axis, the y-axis, and the z-axis may be perpendicular to one another, or may represent different directions that are not perpendicular to one another.

FIG. 1 is a plan view schematically illustrating a portion of a display apparatus according to one or more embodiments. As shown in FIG. 1, the display apparatus according to the present embodiment includes a display panel 10. The display apparatus may be of any type as long as it includes the display panel 10. For example, the display apparatus may be a smartphone, a tablet, a laptop, a television, or a billboard.

The display panel 10 includes a display area DA and a peripheral area PA outside the display area DA. The display area DA is a portion in which an image is displayed, and a plurality of pixels may be arranged in the display area DA. When viewed from a direction approximately perpendicular to the display panel 10, the display area DA may have various shapes, such as a circle, an ellipse, a polygon, and a particular figure. In FIG. 1, the display area DA has an approximately rectangular shape with round corners.

The peripheral area PA may be arranged outside the display area DA along an edge or periphery of the display area DA. The width (in the x-axis direction) of a portion of the peripheral area PA may be less than the width (in the x-axis direction) of the display area DA. Through this structure, if necessary, at least a portion of the peripheral area PA may be easily bent, as described below.

Because the display panel 10 includes a substrate 100 (see FIG. 10), it may be said that the substrate 100 includes the display area DA and the peripheral area PA as described above. Hereinafter, for convenience, it is described that the substrate 100 includes the display area DA and the peripheral area PA.

If necessary, the display panel 10 may also include a main area MR, a bending area BR outside the main area MR, and a sub-area SR arranged opposite to the main area MR with respect to the bending area BR. The display panel 10 may be bent in the bending area BR so that at least a portion of the sub-area SR may overlap the main area MR when viewed from the z-axis direction. However, the present disclosure is not limited to a bendable display apparatus, and may be applied to a display apparatus that is not bendable. The sub-area SR may be a non-display area. By bending the display panel 10 in the bending area BR, when the display apparatus is viewed from the front (in the −z direction), the non-display area may not be visible, and even in a case where the non-display area is visible, the visible area of the non-display area may be reduced or minimized.

A driving chip 20 or the like may be arranged in the sub-area SR of the display panel 10. The driving chip 20 may include an integrated circuit configured to drive the display panel 10. The integrated circuit may be a data driving integrated circuit configured to generate a data signal, but the present disclosure is not limited thereto.

The driving chip 20 may be mounted in the sub-area SR of the display panel 10. The driving chip 20 may be mounted on the same surface as a display surface of the display area DA, but as the display panel 10 is bent in the bending area BR as described above, the driving chip 20 may be disposed on a rear surface of the main area MR.

A printed circuit board 30 or the like may be attached to an end of the sub-area SR of the display panel 10. The printed circuit board 30 or the like may be electrically connected to the driving chip 20 or the like via a pad on the substrate 100.

Hereinafter, an organic light-emitting display apparatus is described as an example of the display apparatus according to one or more embodiments, but the display apparatus of the present disclosure is not limited thereto. In one or more embodiments, the display apparatus of the present disclosure may be an inorganic light-emitting display apparatus (or inorganic electroluminescent (EL) display apparatus), a quantum dot light-emitting display apparatus, or the like. For example, an emission layer of a display device included in the display apparatus may include an organic material or an inorganic material. In addition, the display apparatus may include an emission layer and a quantum dot layer arranged on a path of light emitted from the emission layer.

As described above, the display panel 10 includes the substrate 100. Various components included in the display panel 10 may be disposed on the substrate 100. The substrate 100 may include glass, a metal, or a polymer resin. When the display panel 10 is bent in the bending area BR as described above, it may be necessary that the substrate 100 is flexible or bendable. In this case, the substrate 100 may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may be variously modified. For example, the substrate 100 may have a multi-layered structure including two layers and a barrier layer therebetween, while each of the two layers includes a polymer resin, and the barrier layer including an inorganic material, such as silicon oxide, silicon nitride, or silicon oxynitride.

A plurality of pixels are arranged in the display area DA. Each of the pixels refers to a sub-pixel, and may include a display device, such as an organic light-emitting diode (OLED). For example, each of the pixels may emit red, green, blue, or white light.

The pixels may be electrically connected to outer circuits arranged in the peripheral area PA. A scan driving circuit, an emission control driving circuit, a terminal, a power voltage supply line, an electrode power supply line, and the like may be arranged in the peripheral area PA. The scan driving circuit may be configured to provide a scan signal to the pixels via a scan line. The emission control driving circuit may be configured to provide an emission control signal to the pixels via an emission control line. The terminal arranged in the peripheral area PA of the substrate 100 may be exposed without being covered by an insulating layer, and electrically connected to the printed circuit board 30. A terminal of the printed circuit board 30 may be electrically connected to the terminal of the display panel 10.

The printed circuit board 30 is configured to transmit a signal or power of a controller to the display panel 10. A control signal generated by the controller may be transmitted to each of driving circuits via the printed circuit board 30. In addition, the controller may be configured to transmit a first power voltage ELVDD (or a driving voltage, see FIG. 2) to the power voltage supply line and provide a second power voltage ELVSS (or a common voltage, see FIG. 2) to the electrode power supply line. The first power voltage ELVDD may be transmitted to each of the pixels via a power voltage line 1520 (see FIG. 9) connected to the power voltage supply line, and the second power voltage ELVSS may be transmitted to an opposite electrode 230 (see FIG. 10) of a pixel connected to the electrode power supply line. The electrode power supply line may have a loop shape with one side open, that is, a shape that partially surrounds the display area DA.

Figure 9:
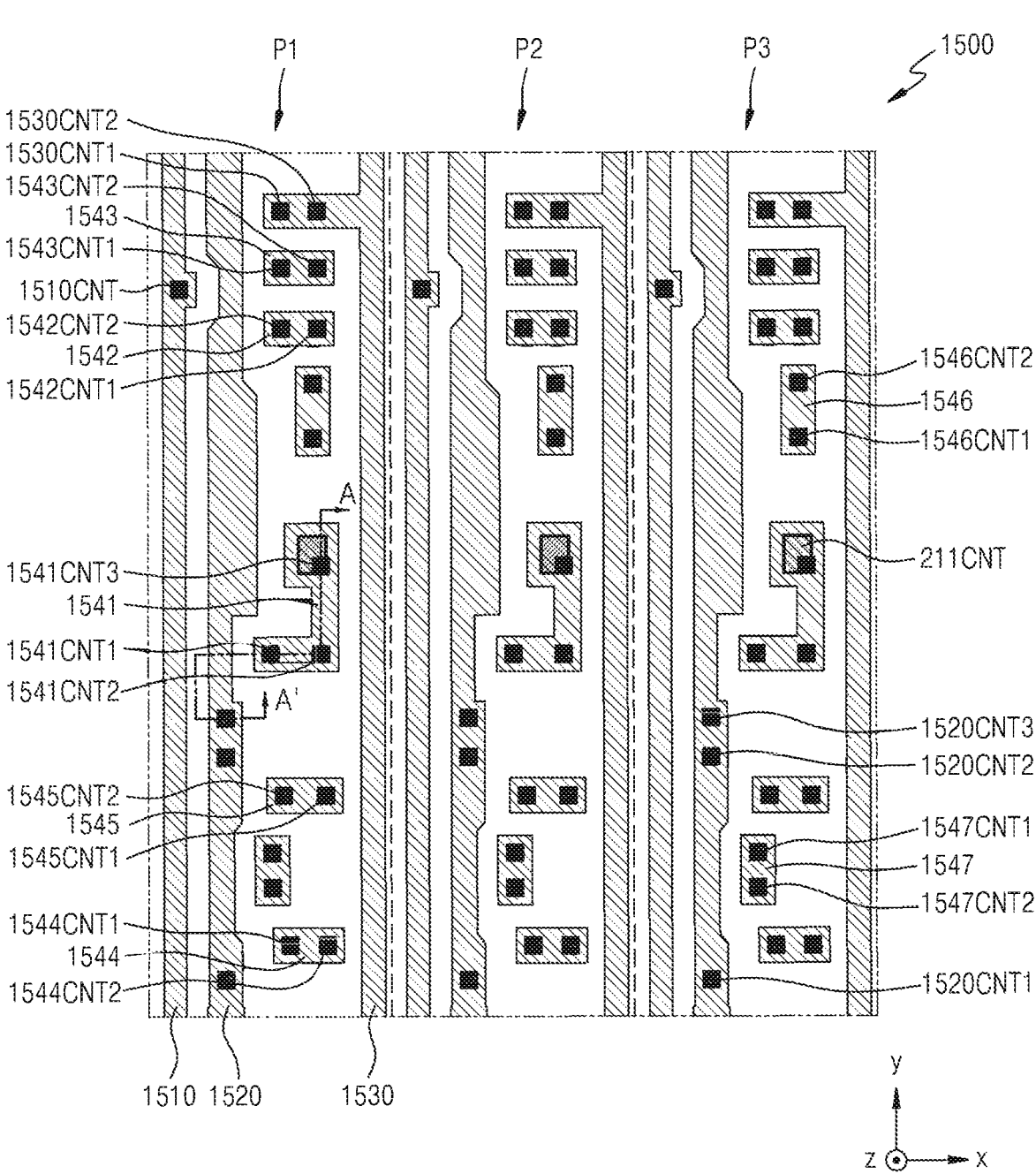

The controller may be configured to generate a data signal, and the generated data signal may be transmitted to the pixels via the driving chip 20 and a data line 1510 (see FIG. 9).

For reference, the term "line" may refer to "wiring." This also applies to the embodiments described below and modifications thereof.

Figure 2:
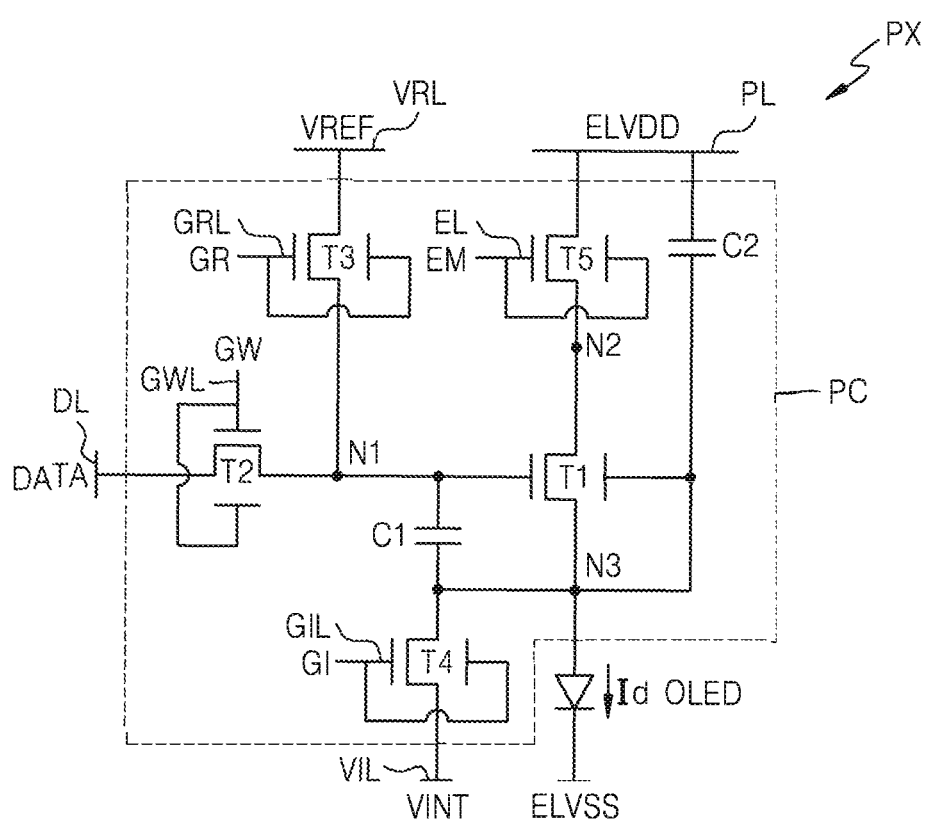
FIG. 2 illustrates a pixel circuit of a pixel included in the display apparatus of FIG. 1.

FIG. 2 illustrates a pixel circuit PC of a pixel PX included in the display apparatus of FIG. 1. That is, FIG. 2 is an equivalent circuit diagram of the pixel PX included in the display apparatus in FIG. 1.

Referring to FIG. 2, the pixel PX may include an organic light-emitting diode OLED as a display element and the pixel circuit PC connected to the organic light-emitting diode OLED. The pixel circuit PC may include first to fifth transistors T1 to T5, a first capacitor C1, and a second capacitor C2. The first transistor T1 is a driving transistor in which the magnitude of a source-drain current is determined according to a potential difference between a gate electrode and a source area of the first transistor T1. The second to fifth transistors T2 to T5 may be switching transistors that are turned on or off according to a potential difference between a gate electrode and a source area, and substantially according to a voltage applied to the gate electrode. The first to fifth transistors T1 to T5 may be implemented as thin-film transistors. According to the type (p-type or n-type) and/or operating conditions of respective transistors, a first terminal of each of the first to fifth transistors T1 to T5 may be a source area or a drain area, and a second terminal of each of the first to fifth transistors T1 to T5 may be a different terminal from the first terminal. For example, when the first terminal is a source area, the second terminal may be a drain area.

The pixel PX may be connected to a first scan line GWL configured to transmit a first scan signal GW, a second scan line GIL configured to transmit a second scan signal GI, a third scan line GRL configured to transmit a third scan signal GR, an emission control line EL configured to transmit an emission control signal EM, and a data line DL configured to transmit a data signal DATA. A power voltage line PL may be configured to transmit the first power voltage ELVDD (or a driving voltage) to the first transistor T1. An initialization voltage line VIL may be configured to transmit an initialization voltage VINT to the organic light-emitting diode OLED. A reference voltage line VRL may be configured to transmit a reference voltage VREF to a first gate electrode of the first transistor T1.

A semiconductor layer of the first to fifth transistors T1 to T5 may include an oxide semiconductor. Because an oxide semiconductor has high carrier mobility and low leakage current, a voltage drop is not large even when a driving time is long. That is, in the case of an oxide semiconductor, a color change of an image according to a voltage drop is not large even during low-frequency driving, and thus, low-frequency driving may be possible. Accordingly, when the semiconductor layer of the first to fifth transistors T1 to T5 includes an oxide semiconductor, a display apparatus in which leakage current is prevented from occurring and power consumption is reduced may be implemented. In addition, when using an oxide semiconductor transistor, a crystallization process by excimer laser annealing (ELA) is not required to form a low-temperature polycrystalline silicon (LTPS) semiconductor transistor, and thus, manufacturing costs of a display panel may be significantly reduced. Accordingly, using an oxide semiconductor transistor is desirable (e.g., advantageous) for implementation of a display apparatus with a large area.

Because an oxide semiconductor is sensitive to light, an amount of current or the like may vary according to external light. Accordingly, it may be considered to absorb or reflect the external light by disposing a metal layer below the oxide semiconductor. The metal layer disposed below the oxide semiconductor of each of the first to fifth transistors T1 to T5 may function as a lower gate electrode. That is, each of the first to fifth transistors T1 to T5 may be a double gate transistor having two gate electrodes. The two gate electrodes may be arranged on different layers, and may overlap each other. For example, each of the first to fifth transistors T1 to T5 may be an N-channel oxide semiconductor transistor, and the gate electrodes of each of the first to fifth transistors T1 to T5 may be arranged to face (e.g., oppose) each other with the oxide semiconductor therebetween.

The first transistor T1 includes a first gate electrode connected to a first node N1, a second gate electrode connected to a third node N3, a first terminal connected to a second node N2, and a second terminal connected to the third node N3. The second gate electrode of the first transistor T1 may be connected to the second terminal of the first transistor T1 to be controlled by a voltage applied to the second terminal of the first transistor T1, and may improve the output saturation of the first transistor T1. The first terminal of the first transistor T1 may be connected to the power voltage line PL via the fifth transistor T5, and the second terminal of the first transistor T1 may be electrically connected to a pixel electrode of the organic light-emitting diode OLED. The first transistor T1 may serve as a driving transistor, and may be configured to receive the data signal DATA according to a switching operation of the second transistor T2 and control the amount of a driving current Id flowing to the organic light-emitting diode OLED.

The second transistor T2, which is a data writing transistor, includes a first gate electrode and a second gate electrode connected to the first scan line GWL, a first terminal connected to the data line DL, and a second terminal connected to the first node N1. The second terminal of the second transistor T2 may be electrically connected to the first gate electrode of the first transistor T1. The second transistor T2 may be configured to be turned on according to the first scan signal GW transmitted from the first scan line GWL and electrically connect the data line DL to the first node N1 to transmit the data signal DATA to the first node N1, the data signal DATA being transmitted from the data line DL.

The third transistor T3, which is a first initialization transistor, includes a first gate electrode and a second gate electrode connected to the third scan line GRL, a first terminal connected to the reference voltage line VRL, and a second terminal connected to the first node N1. The second terminal of the third transistor T3 may be electrically connected to the first gate electrode of the first transistor T1. The third transistor T3 may be configured to be turned on according to the third scan signal GR transmitted from the third scan line GRL and transmit the reference voltage VREF to the first node N1, the reference voltage VREF being transmitted from the reference voltage line VRL.

The fourth transistor T4, which is a second initialization transistor, includes a first gate electrode and a second gate electrode connected to the second scan line GIL, a first terminal connected to the third node N3, and a second terminal connected to the initialization voltage line VIL. The first terminal of the fourth transistor T4 may be electrically connected to the second terminal of the first transistor T1. The fourth transistor T4 may be configured to be turned on according to the second scan signal GI transmitted from the second scan line GIL and transmit the initialization voltage VINT to the third node N3, the initialization voltage VINT being transmitted from the initialization voltage line VIL.

The fifth transistor T5, which is an emission control transistor, includes a first gate electrode and a second gate electrode connected to the emission control line EL, a first terminal connected to the power voltage line PL, and a second terminal connected to the second node N2. The second terminal of the fifth transistor T5 may be electrically connected to the first terminal of the first transistor T1. The fifth transistor T5 may be turned on or off according to the emission control signal EM transmitted from the emission control line EL.

The first capacitor C1, which is a storage capacitor, may be electrically connected between the first node N1 and the third node N3. A first terminal of the first capacitor C1 may be connected to the first gate electrode of the first transistor T1, and a second terminal of the first capacitor C1 may be electrically connected to the second gate electrode and the second terminal of the first transistor T1, the first terminal of the fourth transistor T4, and the pixel electrode of the organic light-emitting diode OLED. The first capacitor C1 as the storage capacitor may be configured to store a threshold voltage of the first transistor T1 and a voltage corresponding to the data signal DATA.

The second capacitor C2, which is a holding capacitor, may be electrically connected between the third node N3 and the power voltage line PL. A first terminal of the second capacitor C2 may be connected to the power voltage line PL, and a second terminal of the second capacitor C2 may be electrically connected to the second gate electrode and the second terminal of the first transistor T1, the second terminal of the first capacitor C1, the first terminal of the fourth transistor T4, and the pixel electrode of organic light-emitting diode OLED. For reference, the capacity of the first capacitor C1 may be greater than the capacity of the second capacitor C2.

The organic light-emitting diode OLED may include a pixel electrode (anode) and an opposite electrode (cathode) facing the pixel electrode, and the opposite electrode may receive the second power voltage ELVSS (or a common voltage). The opposite electrode may be a common electrode that is integrally formed as a single body in a plurality of organic light-emitting diodes OLED.

Figure 3:
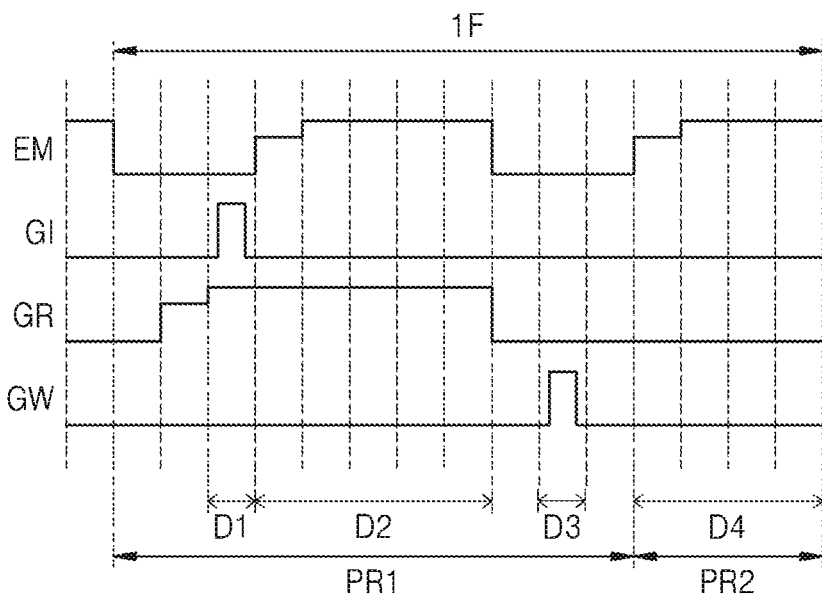
FIG. 3 is a timing diagram of control signals for operating the pixel circuit shown in FIG. 2.

FIG. 3 is a timing diagram of control signals for operating the pixel circuit PC shown in FIG. 2. Hereinafter, descriptions are provided with reference to FIGS. 2 and 3 together.

The pixel PX may operate through first to fourth periods D1 to D4 of one frame 1F. Hereinafter, for convenience, the first to third periods D1 to D3 are referred to as a first non-emission period PR1 during which the pixel PX does not emit light, and the fourth period D4 is referred to as a first emission period PR2 during which the pixel PX emits light.

The second scan signal GI may be supplied as a turn-on voltage during the first period D1. The first scan signal GW may be supplied as the turn-on voltage during the third period D3. That is, a period during which the second scan signal GI has the turn-on voltage may precede a period during which the first scan signal GW has the turn-on voltage. The third scan signal GR may be supplied as the turn-on voltage during the first period D1 and the second period D2. The emission control signal EM may be supplied as a turn-off voltage during the first period D1 and the third period D3, and may be supplied as the turn-on voltage during the second period D2 and the fourth period D4. Pulse widths of the first scan signal GW, the second scan signal GI, and the third scan signal GR may be periods during which the turn-on voltage is maintained. A pulse width of the emission control signal EM may be a period during which the emission control signal EM has the turn-off voltage. In this regard, the term "turn-on voltage" refers to a turn-on voltage of a transistor, and may be, for example, a high-level voltage.

The first power voltage ELVDD (or driving voltage) may be supplied from the power voltage line PL, the reference voltage VREF may be supplied from the reference voltage line VRL, and the initialization voltage VINT may be supplied from the initialization voltage line VIL.

The first period D1 may be an initialization period during which the first node N1 to which the first gate electrode of the first transistor T1 is connected and the third node N3 to which the pixel electrode (anode) of the organic light-emitting diode OLED is connected are initialized.

During the first period D1, the second scan signal GI of the turn-on voltage may be supplied to the second scan line GIL, and the third scan signal GR of the turn-on voltage may be supplied to the third scan line GRL. The first scan signal GW and the emission control signal EM may be supplied as the turn-off voltage. The turn-on voltage of the second scan signal GI may have a width of approximately one horizontal scanning period.

The fourth transistor T4 may be turned on by the second scan signal GI, and the third transistor T3 may be turned on by the third scan signal GR. As the third transistor T3 is turned on, the reference voltage VREF may be supplied to the first node N1, that is, the first gate electrode of the first transistor T1. As the fourth transistor T4 is turned on, a voltage of the third node N3, that is, the pixel electrode of the organic light-emitting diode OLED, may be set as the initialization voltage VINT. That is, by discharging a parasitic capacitor that is formed in the organic light-emitting diode OLED, the organic light-emitting diode OLED may be initialized.

The second period D2 may be a compensation period during which a threshold voltage $V_{th}$ of the first transistor T1 is compensated for. During the second period D2, the first scan signal GW may maintain the turn-off voltage, the second scan signal GI may switch to the turn-off voltage, the third scan signal GR may maintain the turn-on voltage, and the emission control signal EM may switch to the turn-on voltage.

During the second period D2, the third scan signal GR of the turn-on voltage may be supplied to the third scan line GRL so that the third transistor T3 may be turned on, and the emission control signal EM of the turn-on voltage may be supplied to the emission control line EL so that the fifth transistor T5 may be turned on. Accordingly, the first power voltage ELVDD (or driving voltage) may be supplied to the second node N2, and the reference voltage VREF may be supplied to the first node N1, so that the first transistor T1 may be turned on, and when a voltage of the second terminal of the first transistor T1 falls below a difference VREF-$V_{th}$ between the reference voltage VREF and the threshold voltage $V_{th}$ of the first transistor T1, the first transistor T1 may be turned off. In addition, a voltage corresponding to the threshold voltage $V_{th}$ of the first transistor T1 may be charged in the first capacitor C1.

The third period D3 may be a data writing period during which the data signal DATA is supplied to the pixel PX. During the third period D3, the second scan signal GI may maintain the turn-off voltage, the third scan signal GR and the emission control signal EM may switch to the turn-off voltage, and the first scan signal GW may switch to the turn-on voltage. The turn-on voltage of the first scan signal GW may have a width of approximately one horizontal scanning period.

During the third period D3, the first scan signal GW of the turn-on voltage may be supplied to the first scan line GWL so that the second transistor T2 may be turned on. In this case, the third transistor T3, the fourth transistor T4, and the fifth transistor T5 may be respectively turned off by the third scan signal GR, the second scan signal GI, and the emission control signal EM of the turn-off voltage.

The second transistor T2 may transmit the data signal DATA from the data line DL to the first node N1, that is, the first gate electrode of the first transistor T1. Accordingly, a voltage of the first node N1 may be changed from the reference voltage VREF to a voltage corresponding to the data signal DATA. In this case, a voltage of the second node N2 may also be changed according to the amount of change in the voltage of the first node N1. The voltage of the second node N2 may be changed according to a capacity ratio between the first capacitor C1, the second capacitor C2, and the parasitic capacitor of the organic light-emitting diode OLED. Accordingly, the threshold voltage $V_{th}$ of the first transistor T1 and the voltage corresponding to the data signal DATA may be charged in the first capacitor C1.

The fourth period D4 may be a period during which the organic light-emitting diode OLED emits light. During the fourth period D4, the emission control signal EM may switch to the turn-on voltage, and the first scan signal GW, the second scan signal GI, and the third scan signal GR may have the turn-off voltage.

During the fourth period D4, the second transistor T2, the third transistor T3, and the fourth transistor T4 may be respectively turned off by the first scan signal GW, the third scan signal GR, and the second scan signal GI of the turn-off voltage, and the fifth transistor T5 may be turned on by the emission control signal EM of the turn-on voltage so that the first power voltage ELVDD (or a driving voltage) may be supplied to the second node N2.

The first transistor T1 may output a driving current $Id \propto (V_{GS} - V_{th})^2$ having a magnitude corresponding to a voltage stored in the first capacitor C1, that is, a voltage $V_{GS} - V_{th}$ obtained by subtracting the threshold voltage $V_{th}$ of the first transistor T1 from a potential difference $V_{GS}$ between the first gate electrode and the source area of the first transistor T1 (e.g., a potential difference between the first node N1 and the third node N3). Accordingly, the organic light-emitting diode OLED may emit light with a luminance corresponding to the magnitude of the driving current Id regardless of the threshold voltage $V_{th}$ of the first transistor T1.

However, the driving mode as described above is merely an example, and the display apparatus of the present disclosure may operate in other driving modes.

Figure 4:
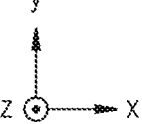
FIG. 4 is a layout schematically illustrating a pixel included the display apparatus of FIG. 1.
Figure 10:
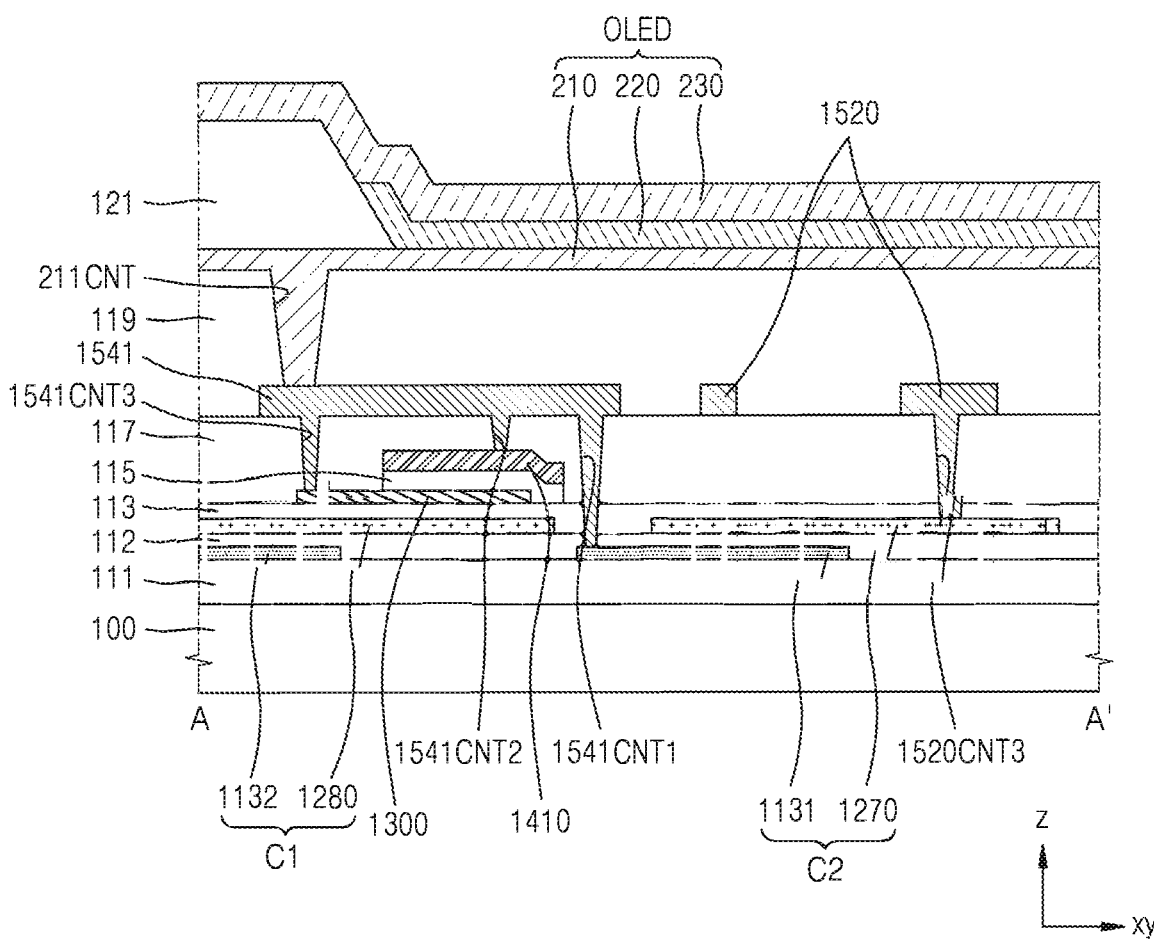
FIG. 10 is a cross-sectional view schematically illustrating a cross-section of the display apparatus taken along the line A-A' in FIGS. 4 to 9.

FIG. 4 is a layout schematically illustrating a pixel included in the display apparatus of FIG. 1, FIGS. 5 to 9 are plan views schematically illustrating layers included in the layout of FIG. 4, and FIG. 10 is a cross-sectional view schematically illustrating a cross-section of the display apparatus taken along line A-A' in FIGS. 4 to 9.

As shown in these drawings, the display apparatus may include a first pixel P1, a second pixel P2, and a third pixel P3 that are adjacent to each other. The first to third pixels P1 to P3 may have the same shape as shown in FIG. 4, etc. However, the present disclosure is not limited thereto, and the first to third pixels P1 to P3 may be configured in various different ways.

The first to third pixels P1 to P3 may include the same or similar pixel circuit. Hereinafter, for convenience of explanation, some conductive patterns are described based on the configuration of the first pixel P1, but these conductive patterns may also be applied to the second pixel P2 and the third pixel P3.

A first buffer layer 111 including silicon oxide, silicon nitride, or silicon oxynitride may be disposed on the substrate 100. The first buffer layer 111 may prevent a phenomenon in which metal atoms or impurities from the substrate 100 diffuse to components disposed on the substrate 100.

Figure 5:
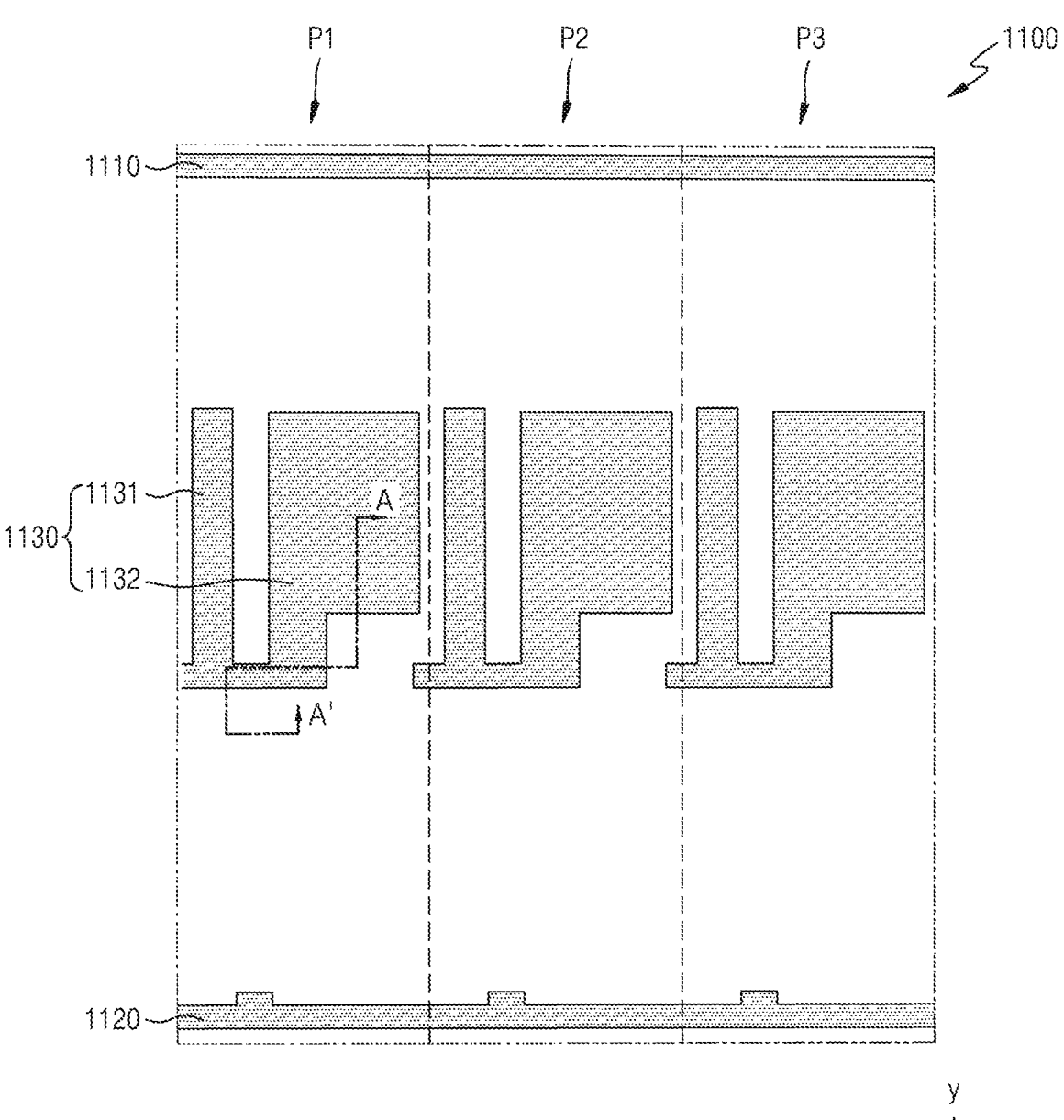
FIGS. 5 to 9 are plan views schematically illustrating layers included in the layout of FIG. 4.

A first lower metal layer 1100 as shown in FIG. 5 may be disposed on the first buffer layer 111. The first lower metal layer 1100 may include a metal, an alloy, a conductive metal oxide, a transparent conductive material, or the like. For example, the first lower metal layer 1100 may include silver (Ag), an Ag-containing alloy, molybdenum (Mo), a Mo-containing alloy, aluminum (Al), an Al-containing alloy, aluminum nitride (AlN), tungsten (W), tungsten nitride (WN), copper (Cu), nickel (Ni), chrome (Cr), chrome nitride (CrN), titanium (Ti), tantalum (Ta), platinum (Pt), scandium (Sc), indium tin oxide (ITO), indium zinc oxide (IZO), or the like. The first lower metal layer 1100 may have a multi-layered structure. For example, the first lower metal layer 1100 may have a two-layered structure of Mo/Al or a three-layered structure of Mo/Al/Mo. However, the layer structure of the first lower metal layer 1100 and materials included therein may be variously modified. For example, the first lower metal layer 1100 may have a three-layered structure of Ti/Al/Ti.

The first lower metal layer 1100 may include an electrode power auxiliary line 1110 extending in a first direction (x-axis direction), a power voltage auxiliary line 1120 also extending in the first direction, and a first capacitor electrode 1130.

As described above, the electrode power supply line arranged outside the display area DA may have a loop shape with one side open, that is, a shape that partially surrounds the display area DA. The electrode power auxiliary line 1110 extending in the first direction may electrically connect one side of the electrode power supply line to the other side thereof, so that a constant second power voltage ELVSS (or common voltage) may be applied to the opposite electrode that is a common electrode for the entire display area DA.

The power voltage auxiliary line 1120 extending in the first direction may be electrically connected to the power voltage line 1520 (see FIG. 9) extending in a second direction (y-axis direction), which is described below. The power voltage auxiliary lines 1120 and the power voltage lines 1520 that are electrically connected to each other may form a conductive layer of a mesh structure in the display area DA, so that a constant first power voltage ELVDD (or a driving voltage) may be maintained in the entire display area DA.

The first capacitor electrode 1130 may have an isolated shape. The first capacitor electrode 1130 may concurrently (e.g., simultaneously) serve as an electrode of the first capacitor C1 and as an electrode of the second capacitor C2. The first capacitor electrode 1130 may be electrically connected to the second gate electrode and the second terminal of the first transistor T1, the first terminal of the fourth transistor T4, and the pixel electrode of the organic light-emitting diode OLED by a first connection electrode 1541 (see FIG. 9) described below. The first capacitor electrode 1130 may include a first portion 1131 and a second portion 1132 that are connected to each other, as shown in FIG. 5. The first portion 1131 may serve as an electrode of the second capacitor C2, and the second portion 1132 may serve as an electrode of the first capacitor C1. This aspect is described below.

A second buffer layer 112 may be disposed over the substrate 100 to cover the first lower metal layer 1100. The second buffer layer 112 may include an insulating material. For example, the second buffer layer 112 may include an inorganic insulating material, such as silicon oxide, silicon nitride, silicon oxynitride, or aluminum oxide.

Figure 6:
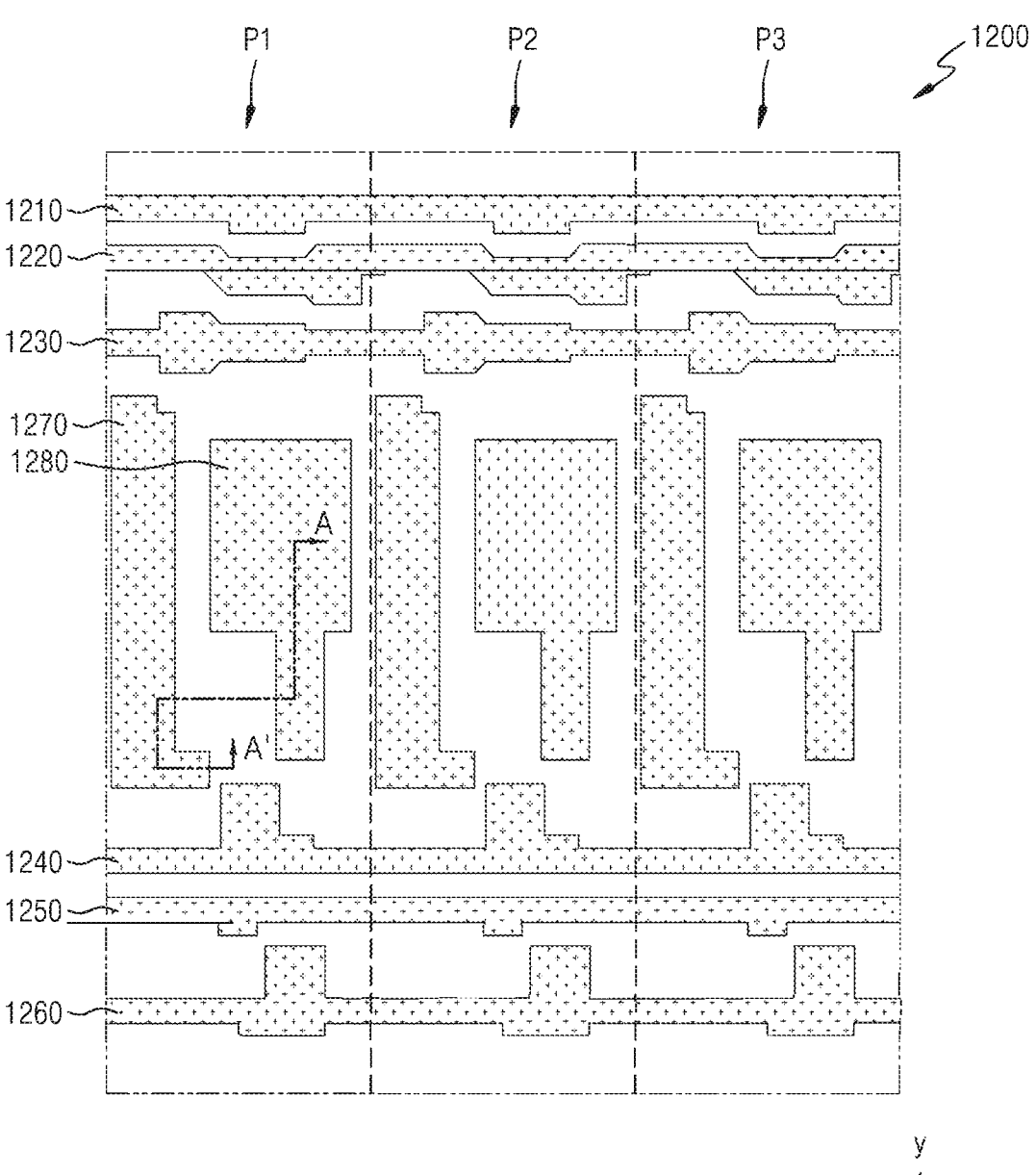

A second lower metal layer 1200 as shown in FIG. 6 may be disposed on the second buffer layer 112. The second lower metal layer 1200 may include a metal, an alloy, a conductive metal oxide, a transparent conductive material, or the like. For example, the second lower metal layer 1200 may include Ag, an Ag-containing alloy, Mo, a Mo-containing alloy, Al, an Al-containing alloy, AlN, W, WN, Cu, Ni, Cr, CrN, Ti, Ta, Pt, Sc, ITO, IZO, or the like. The second lower metal layer 1200 may have a multi-layered structure. For example, the second lower metal layer 1200 may have a two-layered structure of Mo/Al or a three-layered structure of Mo/Al/Mo. However, the layer structure of the second lower metal layer 1200 and materials included therein may be variously modified. For example, the second lower metal layer 1200 may have a three-layered structure of Ti/Al/Ti.

The second lower metal layer 1200 may include a reference voltage auxiliary line 1210 (VRL in FIG. 2), a third scan line 1220 (GRL in FIG. 2), a first scan line 1230 (GWL in FIG. 2), an emission control line 1240 (EL in FIG. 2), an initialization voltage line 1250 (VIL in FIG. 2), and a second scan line 1260 (GIL in FIG. 2), which extend in the first direction (x-axis direction). The function of the reference voltage auxiliary line 1210 is described below. The functions of the other lines are the same as described above with reference to FIGS. 2 and 3.

The second lower metal layer 1200 may include, in addition to the lines described above, a second capacitor electrode 1270 having an isolated shape, and a third capacitor electrode 1280 also having an isolated shape. That is, the third capacitor electrode 1280 may be disposed on the layer on which the second capacitor electrode 1270 is disposed, and may be spaced from the second capacitor electrode 1270. The second capacitor electrode 1270 may be disposed over the first capacitor electrode 1130 to overlap the first capacitor electrode 1130. That is, the second capacitor electrode 1270 may include a portion overlapping the first capacitor electrode 1130. In detail, the second capacitor electrode 1270 may have a portion overlapping the first portion 1131 of the first capacitor electrode 1130. The first portion 1131 of the first capacitor electrode 1130 and the second capacitor electrode 1270 may form the second capacitor C2 (see FIG. 2). The third capacitor electrode 1280 may also be disposed over the first capacitor electrode 1130 to overlap the first capacitor electrode 1130. That is, the third capacitor electrode 1280 may include a portion overlapping the first capacitor electrode 1130. In detail, the third capacitor electrode 1280 may have a portion overlapping the second portion 1132 of the first capacitor electrode 1130. The second portion 1132 of the first capacitor electrode 1130 and the third capacitor electrode 1280 may form the first capacitor C1 (see FIG. 2).

A third buffer layer 113 may be disposed over the substrate 100 to cover the second lower metal layer 1200. The third buffer layer 113 may include an insulating material. For example, the third buffer layer 113 may include an inorganic insulating material, such as silicon oxide, silicon nitride, silicon oxynitride, or aluminum oxide.

Figure 7:
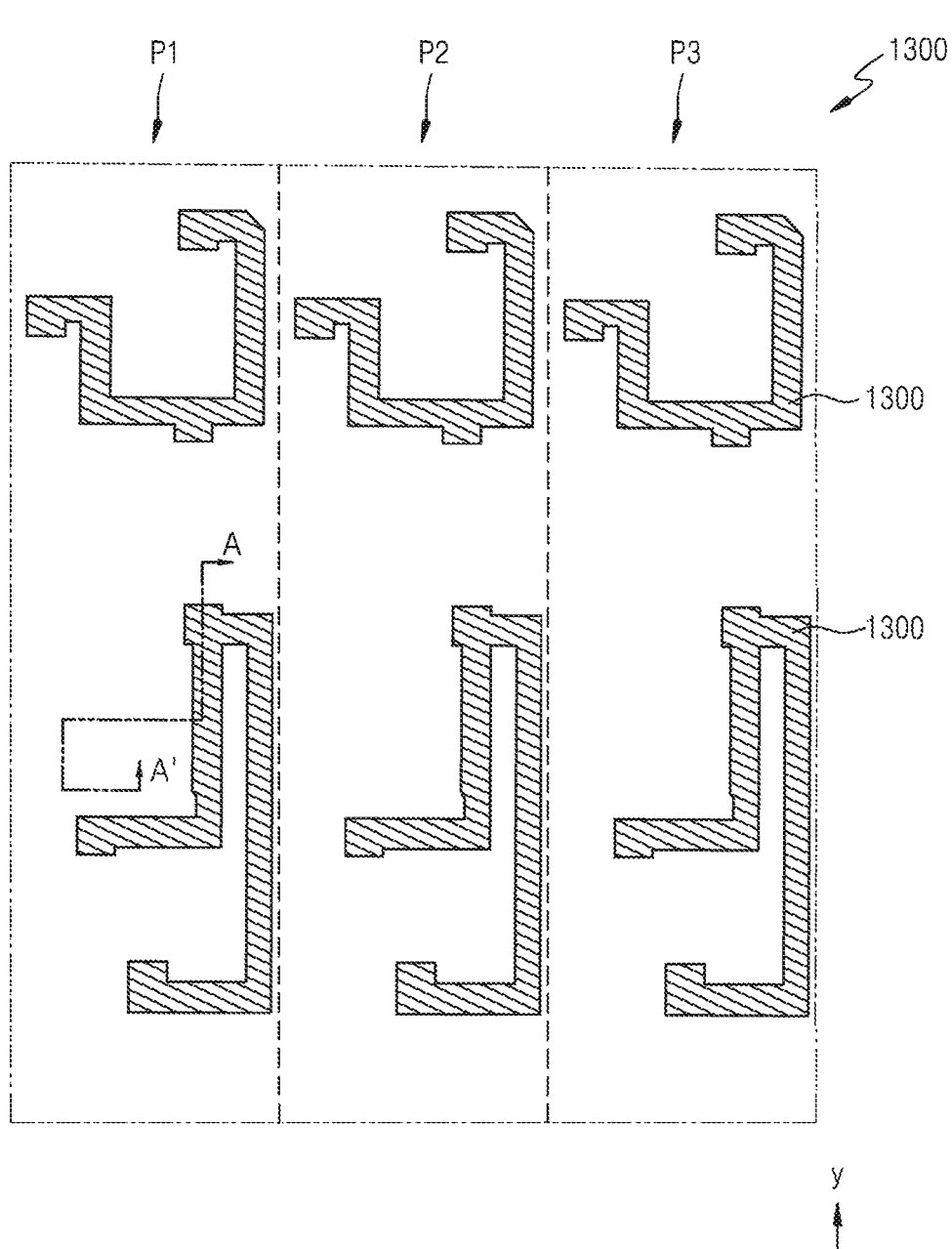

A semiconductor layer 1300 as shown in FIG. 7 may be disposed on the third buffer layer 113. The semiconductor layer 1300 may include an oxide semiconductor, as described above. For example, the semiconductor layer 1300 may include a zinc (Zn) oxide-based material, such as Zn oxide (ZnO or $ZnO_2$), indium (In)—Zn oxide, or gallium (Ga)—In—Zn oxide. Alternatively, the semiconductor layer 1300 may include In—Ga—Zn-oxygen (O) (IGZO), In-tin (Sn)—Zn—O (ITZO), or In—Ga—Sn—Zn—O (IGTZO), in which a metal, such as In, Ga, or Sn, is included in $ZnO_x$ (ZnO or $ZnO_2$).

The first to fifth transistors T1 to T5 described above are arranged along the semiconductor layer 1300. In FIG. 7, the semiconductor layer 1300 includes two portions that are apart from each other. These portions may be electrically connected to components included in a source/drain layer 1500 described below.

A gate insulating layer 115 may be disposed on the semiconductor layer 1300. The gate insulating layer 115 may be disposed over the substrate 100 to cover the semiconductor layer 1300. However, as shown in FIG. 10, the gate insulating layer 115 may also be patterned to have the same shape as a gate layer 1400 (see FIG. 8) disposed on the gate insulating layer 115. The gate insulating layer 115 may include an insulating material. For example, the gate insulating layer 115 may include an inorganic insulating material, such as silicon oxide, silicon nitride, silicon oxynitride, or aluminum oxide.

Figure 8:
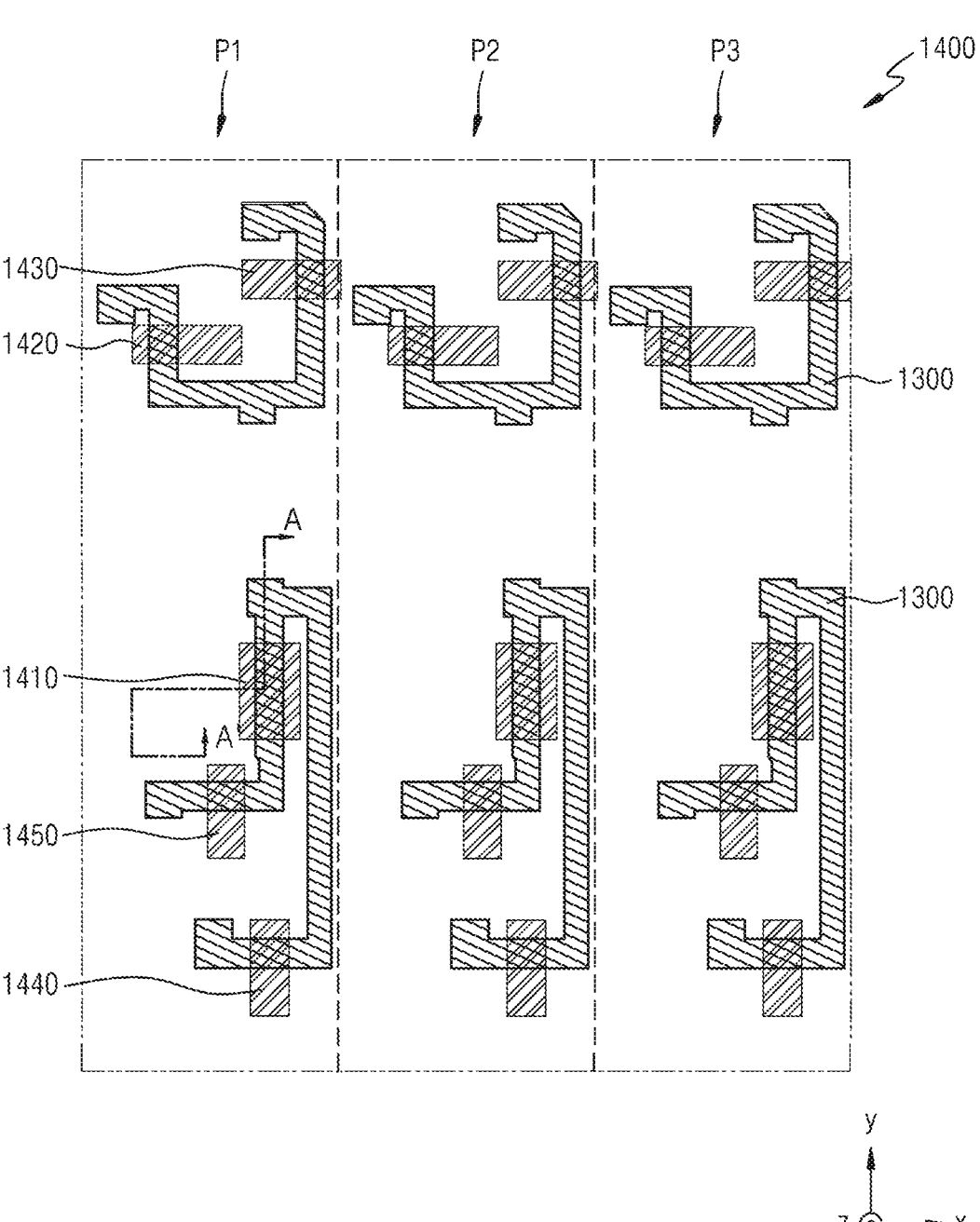

The gate layer 1400 as shown in FIG. 8 may be disposed on the gate insulating layer 115. In FIG. 8, for convenience, the gate layer 1400 is illustrated together with the semiconductor layer 1300 therebelow. The gate layer 1400 may include a first gate electrode 1410, a second gate electrode 1420, a third gate electrode 1430, a fourth gate electrode 1440, and a fifth gate electrode 1450, which may be arranged spaced from each other. In forming the first to fifth gate electrodes 1410 to 1450 that are spaced from each other during a manufacturing process, a conductive layer for forming the gate layer 1400 and an insulating layer for forming the gate insulating layer 115 below the gate layer 1400 may be concurrently (e.g., simultaneously) patterned to have the same shape. Accordingly, each of the first to fifth gate electrodes 1410 to 1450 may have an isolated shape, and may be disposed on the gate insulating layer 115 which also has an isolated shape.

The gate layer 1400 may include a metal, an alloy, a conductive metal oxide, a transparent conductive material, or the like. For example, the gate layer 1400 may include Ag, an Ag-containing alloy, Mo, a Mo-containing alloy, Al, an Al-containing alloy, AlN, W, WN, Cu, Ni, Cr, CrN, Ti, Ta, Pt, Sc, ITO, IZO, or the like. The gate layer 1400 may have a multi-layered structure. For example, the gate layer 1400 may have a two-layered structure of Mo/Al or a three-layered structure of Mo/Al/Mo.

The first gate electrode 1410 may be a first gate electrode of the first transistor T1 which is a driving transistor, the second gate electrode 1420 may be a gate electrode of the second transistor T2 which is a data writing transistor, the third gate electrode 1430 may be a gate electrode of the third transistor T3 which is a first initialization transistor, the fourth gate electrode 1440 may be a gate electrode of the fourth transistor T4 which is a second initialization transistor, and the fifth gate electrode 1450 may be a gate electrode of the fifth transistor T5 which is an emission control transistor.

For reference, because the first to fifth transistors T1 to T5 are double gate transistors as described above, the first to fifth transistors T1 to T5 may further include gate electrodes corresponding to the first to fifth gate electrodes 1410 to 1450, in addition to the first to fifth gate electrodes 1410 to 1450. For example, the first transistor T1 which is a driving transistor may have, as gate electrodes, the first gate electrode 1410 electrically connected to the semiconductor layer 1300 by the first connection electrode 1541 described below, and a portion of the third capacitor electrode 1280 included in the second lower metal layer 1200, the portion overlapping the first gate electrode 1410. The second transistor T2 which is a data writing transistor may have, as gate electrodes, the second gate electrode 1420 electrically connected to the first scan line 1230 by a second connection electrode 1542 described below, and a portion of the first scan line 1230 included in the second lower metal layer 1200, the portion overlapping the second gate electrode 1420. Similarly, each of the third to fifth transistors T3 to T5 may have two gate electrodes in the same manner as the second transistor T2.

The positions of the first to fifth gate electrodes 1410 to 1450 may be understood as corresponding to the positions of the first to fifth transistors T1 to T5. In addition, portions where the first to fifth gate electrodes 1410 to 1450 overlap the semiconductor layer 1300 may be channel areas of the transistors. In the semiconductor layer 1300, one side and the other side of each of the channel areas may respectively be the first terminal and the second terminal of the corresponding thin-film transistor (TFT).

An interlayer insulating layer 117 may be disposed over the substrate 100 to cover the gate layer 1400. When the gate insulating layer 115 is patterned to correspond to components of the gate layer 1400, as shown in FIG. 10, the interlayer insulating layer 117 may be disposed on the third buffer layer 113 to cover the gate layer 1400. The interlayer insulating layer 117 may include an insulating material. For example, the interlayer insulating layer 117 may include silicon oxide, silicon nitride, silicon oxynitride, aluminum oxide, or the like.

A source/drain layer 1500 as shown in FIG. 9 may be disposed on the interlayer insulating layer 117.

The source/drain layer 1500 may include the data line 1510 (DL in FIG. 2), the power voltage line 1520 (PL in FIG. 2), and a reference voltage line 1530 (VRL in FIG. 2), which extend approximately in the second direction (y-axis direction). In addition to these lines, the source/drain layer 1500 may include connection electrodes having isolated shapes. In FIG. 9, the source/drain layer 1500 includes the first connection electrode 1541, the second connection electrode 1542, a third connection electrode 1543, a fourth connection electrode 1544, a fifth connection electrode 1545, a sixth connection electrode 1546, and a seventh connection electrode 1547.

The source/drain layer 1500 may include a metal, an alloy, a conductive metal oxide, a transparent conductive material, or the like. For example, the source/drain layer 1500 may include Ag, an Ag-containing alloy, Mo, a Mo-containing alloy, Al, an Al-containing alloy, AlN, W, WN, Cu, Ni, Cr, CrN, Ti, Ta, Pt, Sc, ITO, IZO, or the like. The source/drain layer 1500 may have a multi-layered structure. For example, the source/drain layer 1500 may have a two-layered structure of Ti/Al or a three-layered structure of Ti/Al/Ti.

The data line 1510 may be electrically connected to the semiconductor layer 1300 therebelow via a contact hole 1510CNT, so that the data signal DATA from the data line 1510 may be transmitted to the semiconductor layer 1300 and applied to the first terminal of the second transistor T2.

The power voltage line 1520 is electrically connected to the power voltage auxiliary line 1120 therebelow via a contact hole 1520CNT1. Because the power voltage auxiliary line 1120 extends approximately in the first direction (x-axis direction) and the power voltage line 1520 extends approximately in the second direction (y-axis direction), the power voltage auxiliary line 1120 and the power voltage line 1520 that are electrically connected to each other may form a conductive layer of a mesh structure in the display area DA, so that a constant first power voltage ELVDD (or driving voltage) may be maintained in the entire display area DA.

The power voltage line 1520 is electrically connected to the semiconductor layer 1300 therebelow via a contact hole 1520CNT2. Accordingly, the first power voltage ELVDD (or a driving voltage) may be transmitted to the semiconductor layer 1300 to be applied to the first terminal of the fifth transistor T5. In addition, the power voltage line 1520 is electrically connected to the second capacitor electrode 1270 of the second lower metal layer 1200 therebelow via a contact hole 1520CNT3. Accordingly, the first power voltage ELVDD (or a driving voltage) may be applied to the second capacitor electrode 1270 of the second capacitor C2.

The reference voltage line 1530 is electrically connected to the reference voltage auxiliary line 1210 of the second lower metal layer 1200 via a contact hole 1530CNT1. Because the reference voltage auxiliary line 1210 extends approximately in the first direction (x-axis direction) and the reference voltage line 1530 extends approximately in the second direction (y-axis direction), the reference voltage auxiliary line 1210 and the reference voltage line 1530 that are electrically connected to each other may form a conductive layer of a mesh structure in the display area DA, so that a constant reference voltage VREF may be maintained in the entire display area DA. In addition, the reference voltage line 1530 is electrically connected to the semiconductor layer 1300 therebelow via a contact hole 1530CNT2. Accordingly, the reference voltage VREF may be transmitted to the semiconductor layer 1300 to be applied to the first terminal of the third transistor T3.

The first connection electrode 1541 is electrically connected to the first capacitor electrode 1130 of the first lower metal layer 1100 therebelow via a contact hole 1541CNT1. In addition, the first connection electrode 1541 is electrically connected to the first gate electrode 1410 of the first transistor T1 therebelow via a contact hole 1541CNT2. Furthermore, the first connection electrode 1541 is electrically connected to the semiconductor layer 1300 therebelow, and specifically, to the second terminal of the first transistor T1, via a contact hole 1541CNT3. As described above, the first connection electrode 1541 may serve to configure the third node N3 of FIG. 2.

The first connection electrode 1541 is connected to a pixel electrode 210 of the organic light-emitting diode OLED over the first connection electrode 1541 via a contact hole 211CNT formed in a planarization layer 119 disposed on the first connection electrode 1541, which is described below. Accordingly, the driving current Id or the initialization voltage VINT from the semiconductor layer 1300 may be transmitted to the pixel electrode 210 of the organic light-emitting diode OLED via the first connection electrode 1541.

The second connection electrode 1542 is electrically connected to the first scan line 1230 therebelow via a contact hole 1542CNT1. Also, the second connection electrode 1542 is electrically connected to the second gate electrode 1420 therebelow via a contact hole 1542CNT2. Accordingly, the second connection electrode 1542 allows a scan signal from the first scan line 1230 to be applied to the second gate electrode 1420 of the second transistor T2 which is a data writing transistor.

The third connection electrode 1543 is electrically connected to the third scan line 1220 therebelow via a contact hole 1543CNT1. Also, the third connection electrode 1543 is electrically connected to the third gate electrode 1430 therebelow via a contact hole 1543CNT2. Accordingly, the third connection electrode 1543 allows a scan signal from the third scan line 1220 to be applied to the third gate electrode 1430 of the third transistor T3 which is a first initialization transistor.

The fourth connection electrode 1544 is electrically connected to the second scan line 1260 therebelow via a contact hole 1544CNT1. Also, the fourth connection electrode 1544 is electrically connected to the fourth gate electrode 1440 therebelow via a contact hole 1544CNT2. Accordingly, the fourth connection electrode 1544 allows a scan signal from the second scan line 1260 to be applied to the fourth gate electrode 1440 of the fourth transistor T4 which is a second initialization transistor.

The fifth connection electrode 1545 is electrically connected to the emission control line 1240 therebelow via a contact hole 1545CNT1. Also, the fifth connection electrode 1545 is electrically connected to the fifth gate electrode 1450 therebelow via a contact hole 1545CNT2. Accordingly, the fifth connection electrode 1545 allows an emission control signal from the emission control line 1240 to be applied to the fifth gate electrode 1450 of the fifth transistor T5 which is an emission control transistor.

The sixth connection electrode 1546 is electrically connected to the third capacitor electrode 1280 therebelow via a contact hole 1546CNT1. Also, the sixth connection electrode 1546 is electrically connected to the semiconductor layer 1300 therebelow via a contact hole 1546CNT2. Accordingly, the sixth connection electrode 1546 electrically connects the third capacitor electrode 1280 of the first capacitor C1 to the second terminal of the second transistor T2 and the second terminal of the third transistor T3, the second transistor T2 being a data writing transistor, and the third transistor T3 being a first initialization transistor. As described above, the sixth connection electrode 1546 may serve to configure the first node N1 of FIG. 2.

The seventh connection electrode 1547 is electrically connected to the initialization voltage line 1250 therebelow via a contact hole 1547CNT1. Also, the seventh connection electrode 1547 is electrically connected to the semiconductor layer 1300 therebelow via a contact hole 1547CNT2. Accordingly, the seventh connection electrode 1547 allows the initialization voltage VINT from the initialization voltage line 1250 to be applied to the second terminal of the fourth transistor T4 which is a second initialization transistor.

The planarization layer 119 may cover the source/drain layer 1500 and may be disposed on the interlayer insulating layer 117. The planarization layer 119 may include an organic insulating material. For example, the planarization layer 119 may include photoresist, benzocyclobutene (BCB), polyimide, hexamethyldisiloxane (HMDSO), polymethylmethacrylate (PMMA), polystyrene, a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

The organic light-emitting diode OLED may be disposed on the planarization layer 119. The organic light-emitting diode OLED may include the pixel electrode 210, an intermediate layer 220 including an emission layer, and the opposite electrode 230.

The pixel electrode 210 may be a transmissive or semi-transmissive electrode or a reflective electrode. For example, the pixel electrode 210 may include a reflective layer including Ag, Mg, Al, Pt, Pd, Au, Ni, Nd, Ir, Cr, or a compound thereof, and a transparent or semi-transparent electrode layer disposed on the reflective layer. The transparent or semi-transparent electrode layer may include at least one selected from among ITO, IZO, ZnO$_x$ (ZnO or ZnO$_2$), indium oxide (In$_2$O$_3$), indium gallium oxide (IGO), and aluminum zinc oxide (AZO). For example, the pixel electrode 210 may have a three-layered structure of ITO/Ag/ITO.

A pixel defining layer 121 may be disposed over the planarization layer 119. The pixel defining layer 121 may prevent an arc or the like from occurring at an edge of the pixel electrode 210 by increasing a distance between the edge of the pixel electrode 210 and the opposite electrode 230 over the pixel electrode 210. That is, the pixel defining layer 121 may have an opening to expose a central portion of the pixel electrode 210. The pixel defining layer 121 may include at least one organic insulating material selected from among polyimide, polyamide, acrylic resin, BCB, and phenolic resin, and may be formed by spin coating or the like.

At least a portion of the intermediate layer 220 of the organic light-emitting diode OLED, the intermediate layer 220 including an emission layer, may be arranged in the opening formed in the pixel defining layer 121. The emission area of the organic light-emitting diode OLED may be defined by the opening. The intermediate layer 220 may include an emission layer. The emission layer may include an organic material including a fluorescent or phosphorous material that emits red, green, blue, or white light. The emission layer may include a low-molecular weight organic material or a high-molecular weight organic material, and a functional layer, such as a hole transport layer (HTL), a hole injection layer (HIL), an electron transport layer (ETL), or an electron injection layer (EIL), may selectively be further disposed below or over the emission layer.

The emission layer may have a patterned shape to correspond to the pixel electrode 210. Layers other than the emission layer included in the intermediate layer 220 may be modified in various ways. For example, the layers may be integrally formed as a single body across a plurality of pixel electrodes 210.

The opposite electrode 230 may be a light-transmitting electrode or a reflective electrode. For example, the opposite electrode 230 may be a transparent or semi-transparent electrode, and may include a metal thin-film including lithium (Li), calcium (Ca), lithium fluoride (LiF), Al, Ag, Mg, and a compound thereof having a small work function. In addition, the opposite electrode 230 may further include a transparent conductive oxide (TCO) layer, such as an ITO layer, an IZO layer, a ZnO or ZnO$_2$ layer, or an In$_2$O$_3$ layer, disposed on the metal thin-film. The opposite electrode 230 may be integrally formed as a single body over the entire surface of the display area DA, and may be disposed over the intermediate layer 220 and the pixel defining layer 121.

In the case of the display apparatus according to the present embodiment, the first capacitor C1 is formed by the second portion 1132 of the first capacitor electrode 1130 and the third capacitor electrode 1280 over the first capacitor electrode 1130, and the second capacitor C2 is formed by the first portion 1131 of the first capacitor electrode 1130 and the second capacitor electrode 1270 over the first capacitor electrode 1130. In this regard, the second buffer layer 112 which is an inorganic insulating layer including an inorganic insulating material, such as silicon oxide, silicon nitride, silicon oxynitride, or aluminum oxide, is interposed between the second portion 1132 of the first capacitor electrode 1130 and the third capacitor electrode 1280, and between the first portion 1131 of the first capacitor electrode 1130 and the second capacitor electrode 1270.

The inorganic insulating layer has a smaller thickness than an organic insulating layer, and has a relatively high dielectric constant. Accordingly, through the configuration described above, the capacitance of each of the first capacitor C1 and the second capacitor C2 may be significantly increased. When implementing a high-resolution display apparatus, the area of each of the capacitors in a plan view is inevitably reduced. However, in the case of the display apparatus according to the present embodiment, through the configuration as described above, the capacitances of the first capacitor C1 and the second capacitor C2 may be maintained sufficiently high while implementing a high-resolution display apparatus.

Figure 11:
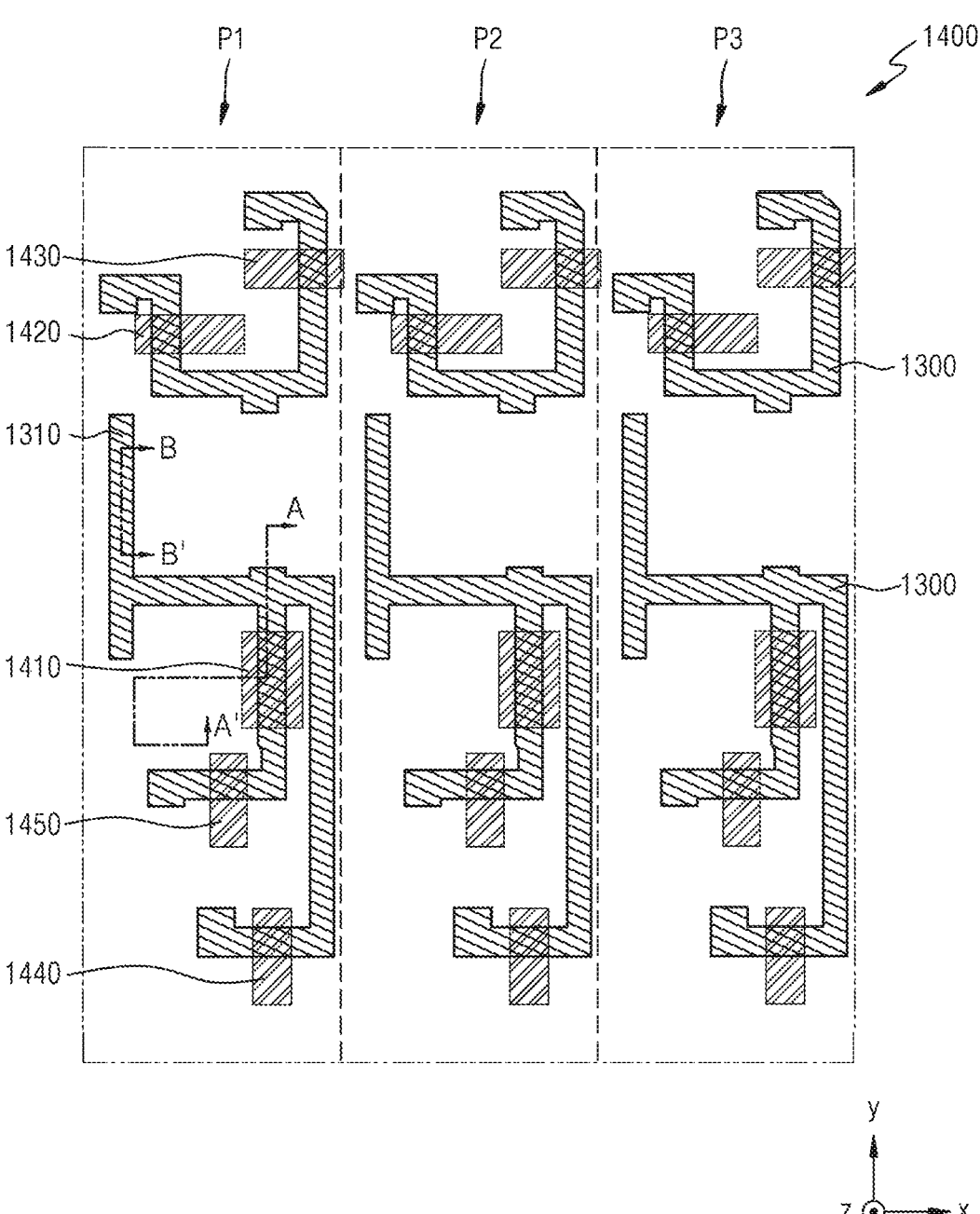
FIG. 11 is a plan view schematically illustrating a semiconductor layer and a gate layer included in a pixel of a display apparatus, according to one or more embodiments.
Figure 12:
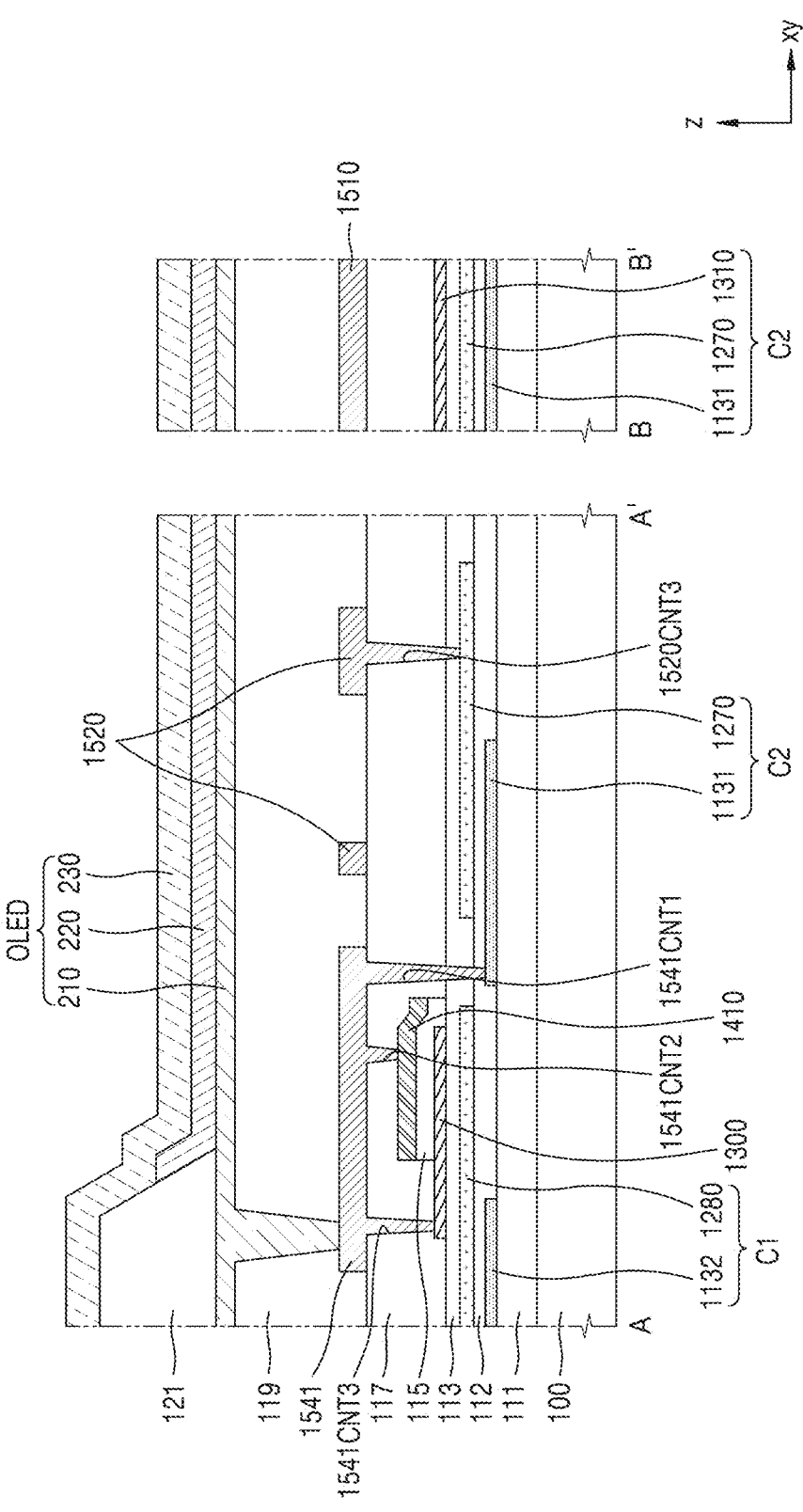
FIG. 12 is a cross-sectional view schematically illustrating cross-sections of the display apparatus taken along the lines A-A' and B-B' in FIG. 11.

FIG. 11 is a plan view schematically illustrating the semiconductor layer 1300 and the gate layer 1400 included in a pixel of the display apparatus, according to one or more embodiments, and FIG. 12 is a cross-sectional view schematically illustrating cross-sections of the display apparatus taken along the lines A-A' and B-B' in FIG. 11. A pixel of the display apparatus according to the present embodiment may include the first lower metal layer 1100 of FIG. 5, the second lower metal layer 1200 of FIG. 6, the semiconductor layer 1300 and the gate layer 1400 of FIG. 11, and the source/drain layer 1500 of FIG. 9.

The semiconductor layer 1300 of the display apparatus according to the present embodiment is different from the semiconductor layer 1300 of the display apparatus according to the embodiment described above with reference to FIGS. 7 and 8 in that a portion of the semiconductor layer 1300 extends and overlaps the second capacitor electrode 1270, the portion corresponding to the second terminal of the first transistor T1 which is a driving transistor. In FIG. 11, the extended portion of the semiconductor layer 1300 is denoted by reference numeral 1310. The extended portion of the semiconductor layer 1300 may be referred to as a fourth capacitor electrode 1310. Accordingly, the fourth capacitor electrode 1310 and the semiconductor layer 1300 may be integrally formed as a single body. Therefore, the fourth capacitor electrode 1310 may include an oxide semiconductor, similar to the semiconductor layer 1300.

In the case of the display apparatus according to the present embodiment, the fourth capacitor electrode 1310 is disposed over the second capacitor electrode 1270 to overlap the second capacitor electrode 1270, as shown in a portion on the right side in FIG. 12 schematically illustrating a cross section of the display apparatus taken along the line B-B' in FIG. 11. In addition, because the fourth capacitor electrode 1310 extends from a portion of the semiconductor layer 1300, the portion corresponding to the second terminal of the first transistor T1 which is a driving transistor, the fourth capacitor electrode 1310 is electrically connected to the first portion 1131 of the first capacitor electrode 1130 via the first connection electrode 1541. Accordingly, it may be considered that a capacitor formed by the first portion 1131 of the first capacitor electrode 1130 of the first lower metal layer 1100 and the second capacitor electrode 1270 of the second lower metal layer 1200 is connected in parallel with a capacitor formed by the fourth capacitor electrode 1310 of the semiconductor layer 1300 and the second capacitor electrode 1270 of the second lower metal layer 1200.

When the capacitors are connected in parallel with each other, the total capacitance is the sum of the capacitances of the respective capacitors. Accordingly, the capacitance of the second capacitor C2 formed by the first portion 1131 of the first capacitor electrode 1130, the second capacitor electrode 1270, and the fourth capacitor electrode 1310 may be significantly increased, without expanding the area of the second capacitor C2 in a plan view.

For reference, because the fourth capacitor electrode 1310 is a portion of the semiconductor layer 1300, if necessary, the portion corresponding to the fourth capacitor electrode 1310 may be doped with impurities or the like to increase the conductivity of the portion. For example, when doping is performed in a state in which the gate layer 1400 is formed as shown in FIG. 11, the gate layer 1400 may serve as a shield, such that a portion of the semiconductor layer 1300 which is covered by the gate layer 1400 may not be doped and serve as a channel, and a portion of the semiconductor layer 1300 which is not covered by the gate layer 1400 may have an increase in conductivity, thereby serving the same and/or similar function as a wiring or an electrode. This also applies to the embodiments described above and below and modifications thereof.

Figure 13:
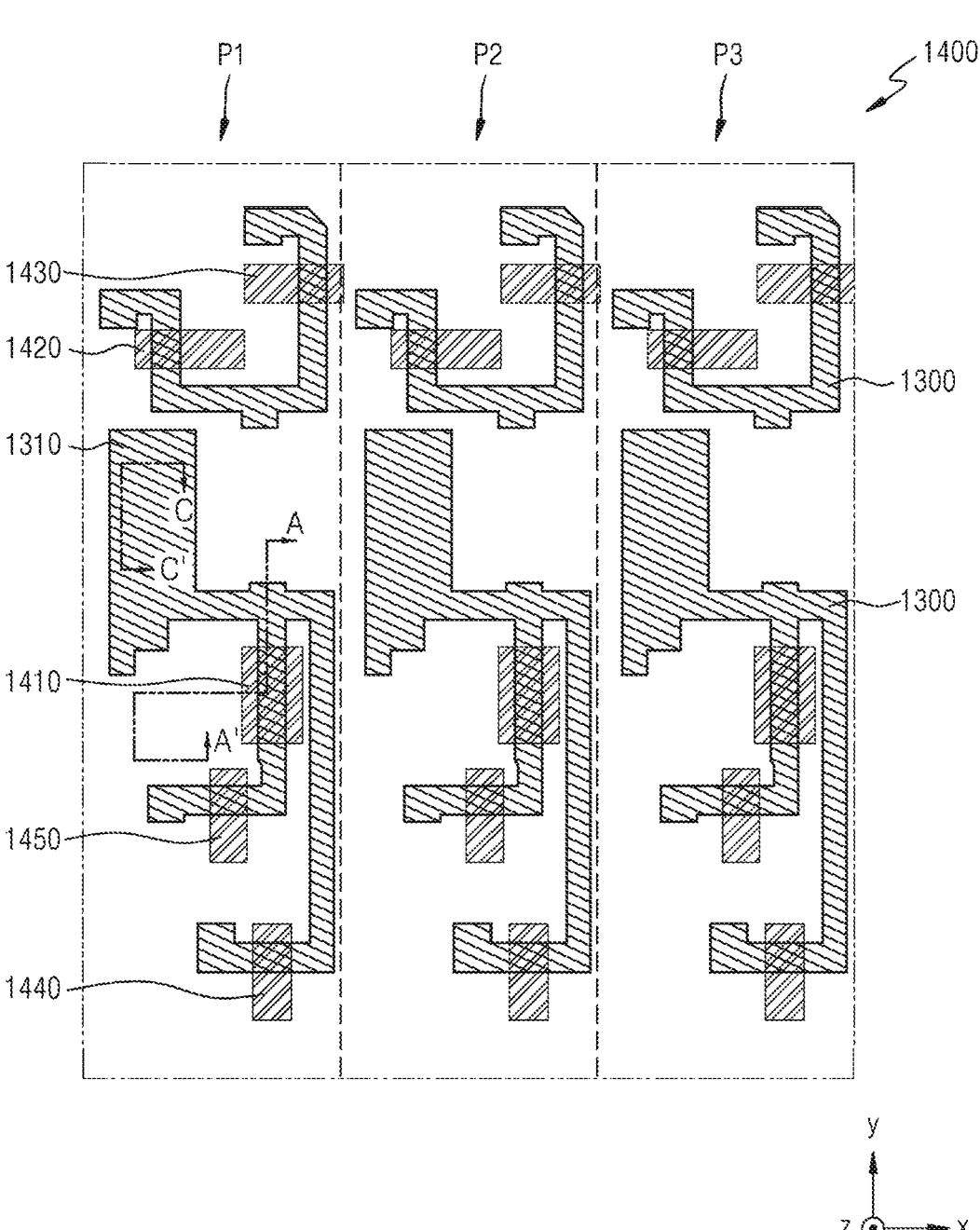
FIG. 13 is a plan view schematically illustrating a semiconductor layer and a gate layer included in a pixel of a display apparatus, according to one or more embodiments.
Figure 14:
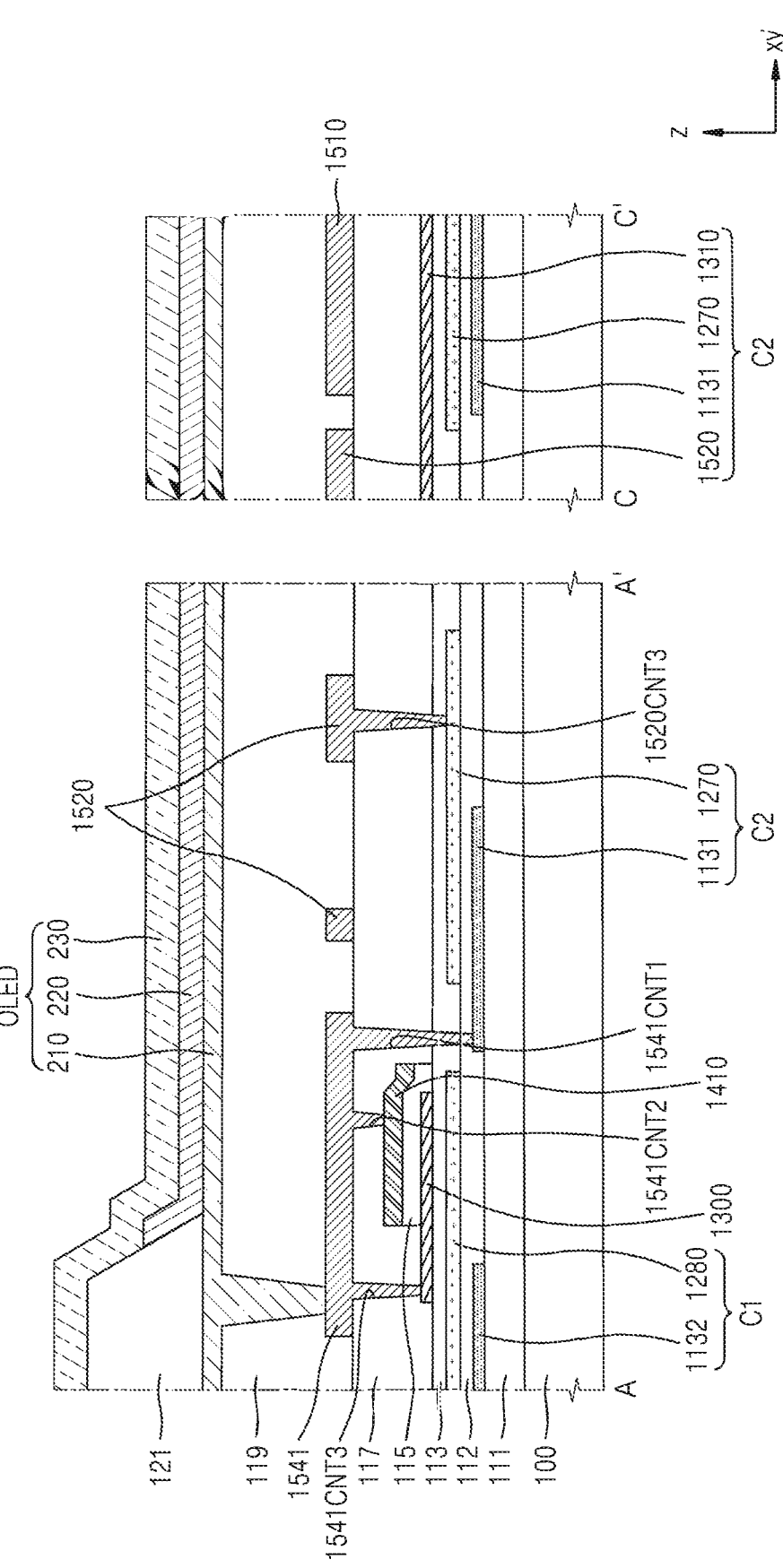
FIG. 14 is a cross-sectional view schematically illustrating cross-sections of the display apparatus taken along the lines A-A' and C-C' in FIG. 13.

FIG. 13 is a plan view schematically illustrating the semiconductor layer 1300 and the gate layer 1400 included in a pixel of the display apparatus, according to one or more embodiments, and FIG. 14 is a cross-sectional view schematically illustrating cross-sections of the display apparatus taken along the lines A-A' and C-C' in FIG. 13. A pixel of the display apparatus according to the present embodiment may include the first lower metal layer 1100 of FIG. 5, the second lower metal layer 1200 of FIG. 6, the semiconductor layer 1300 and the gate layer 1400 of FIG. 13, and the source/drain layer 1500 of FIG. 9.

The semiconductor layer 1300 of the display apparatus according to the present embodiment is different from the semiconductor layer 1300 of the display apparatus according to the embodiment described above with reference to FIGS. 11 and 12 in that the width of the fourth capacitor electrode 1310 in the first direction (x-axis direction) is increased. Accordingly, the fourth capacitor electrode 1310 has a portion overlapping the power voltage line 1520 which is disposed over the fourth capacitor electrode 1310. That is, the fourth capacitor electrode 1310 has a portion overlapping the second capacitor electrode 1270 below the fourth capacitor electrode 1310 and a portion overlapping the power voltage line 1520 which is disposed over the fourth capacitor electrode 1310. Regarding the layer structure, the fourth capacitor electrode 1310 is interposed between the second capacitor electrode 1270 and the power voltage line 1520.

As described above with reference to FIGS. 11 and 12, the fourth capacitor electrode 1310 may be understood as an extension of a portion of the semiconductor layer 1300, the portion corresponding to the second terminal of the first transistor T1 which is a driving transistor. Accordingly, the fourth capacitor electrode 1310 and the semiconductor layer 1300 may be integrally formed as a single body. Therefore, the fourth capacitor electrode 1310 may include an oxide semiconductor, similar to the semiconductor layer 1300.

In the case of the display apparatus according to the present embodiment, the fourth capacitor electrode 1310 is disposed over the second capacitor electrode 1270 to overlap the second capacitor electrode 1270, as shown in a portion on the right side in FIG. 14 schematically illustrating a cross section of the display apparatus taken along the line C-C' in FIG. 13. In addition, the fourth capacitor electrode 1310 has a portion overlapping the power voltage line 1520 that is disposed over the fourth capacitor electrode 1310. In addition, because the fourth capacitor electrode 1310 extends from a portion of the semiconductor layer 1300, the portion corresponding to the second terminal of the first transistor T1 that is a driving transistor, the fourth capacitor electrode 1310 is electrically connected to the first portion 1131 of the first capacitor electrode 1130 via the first connection electrode 1541. The power voltage line 1520 is electrically connected to the second capacitor electrode 1270 via the contact hole 1520CNT3. Accordingly, it may be considered that a total of three capacitors including a capacitor formed by the first portion 1131 of the first capacitor electrode 1130 of the first lower metal layer 1100 and the second capacitor electrode 1270 of the second lower metal layer 1200, a capacitor formed by the fourth capacitor electrode 1310 of the semiconductor layer 1300 and the second capacitor electrode 1270 of the second lower metal layer 1200, and a capacitor formed by the fourth capacitor electrode 1310 of the semiconductor layer 1300 and the power voltage line 1520 are connected in parallel with each other.

When the capacitors are connected in parallel with each other, the total capacitance is the sum of the capacitances of the respective capacitors. Accordingly, the capacitance of the second capacitor C2 formed by the first portion 1131 of the first capacitor electrode 1130, the second capacitor electrode 1270, the fourth capacitor electrode 1310, and the power voltage line 1520 may be significantly increased, without expanding the area of the second capacitor C2 in a plan view.

Figure 15:
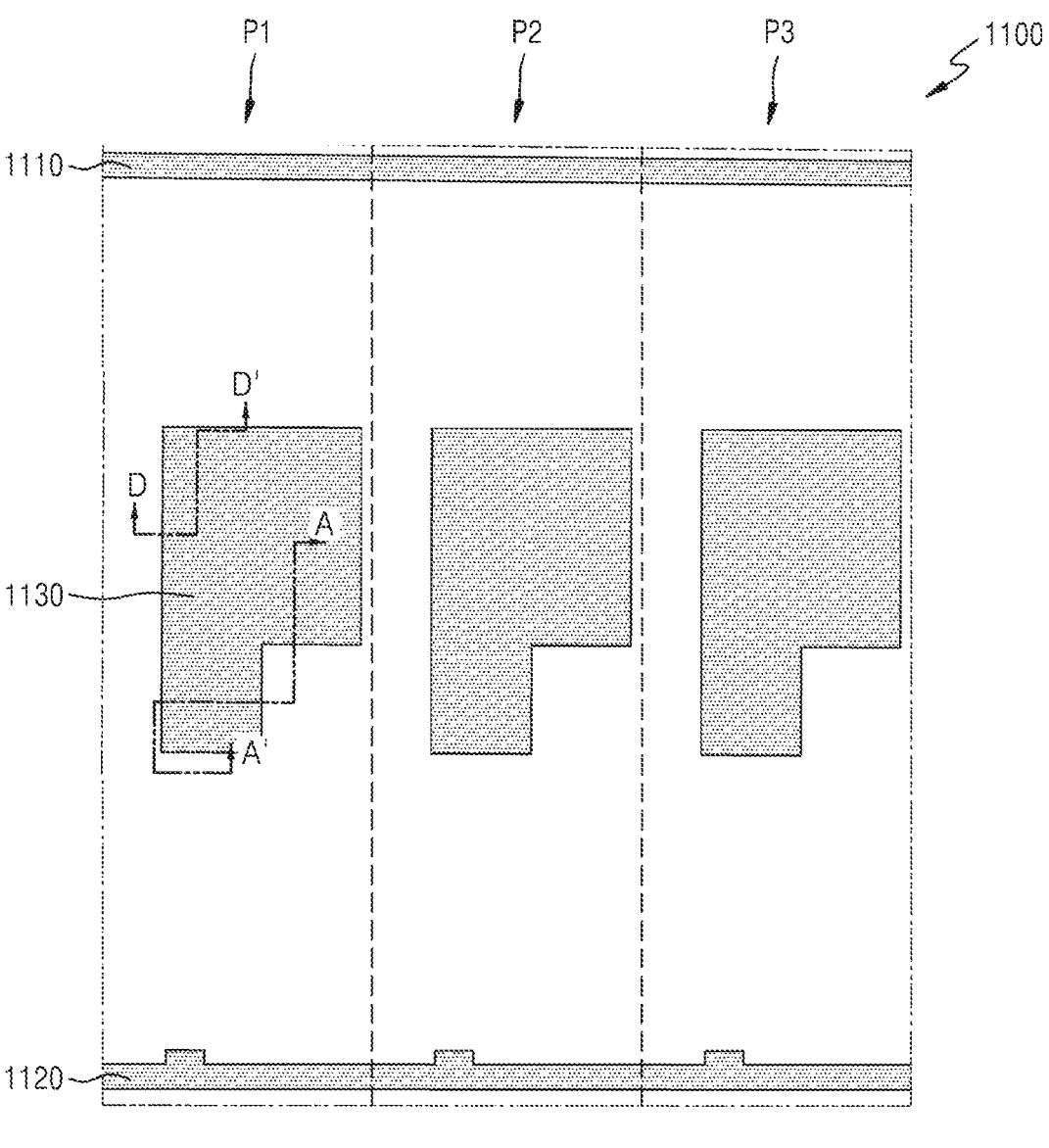
FIGS. 15 to 18 are plan views schematically illustrating layers included in a pixel of a display apparatus, according to one or more embodiments.
Figure 16:
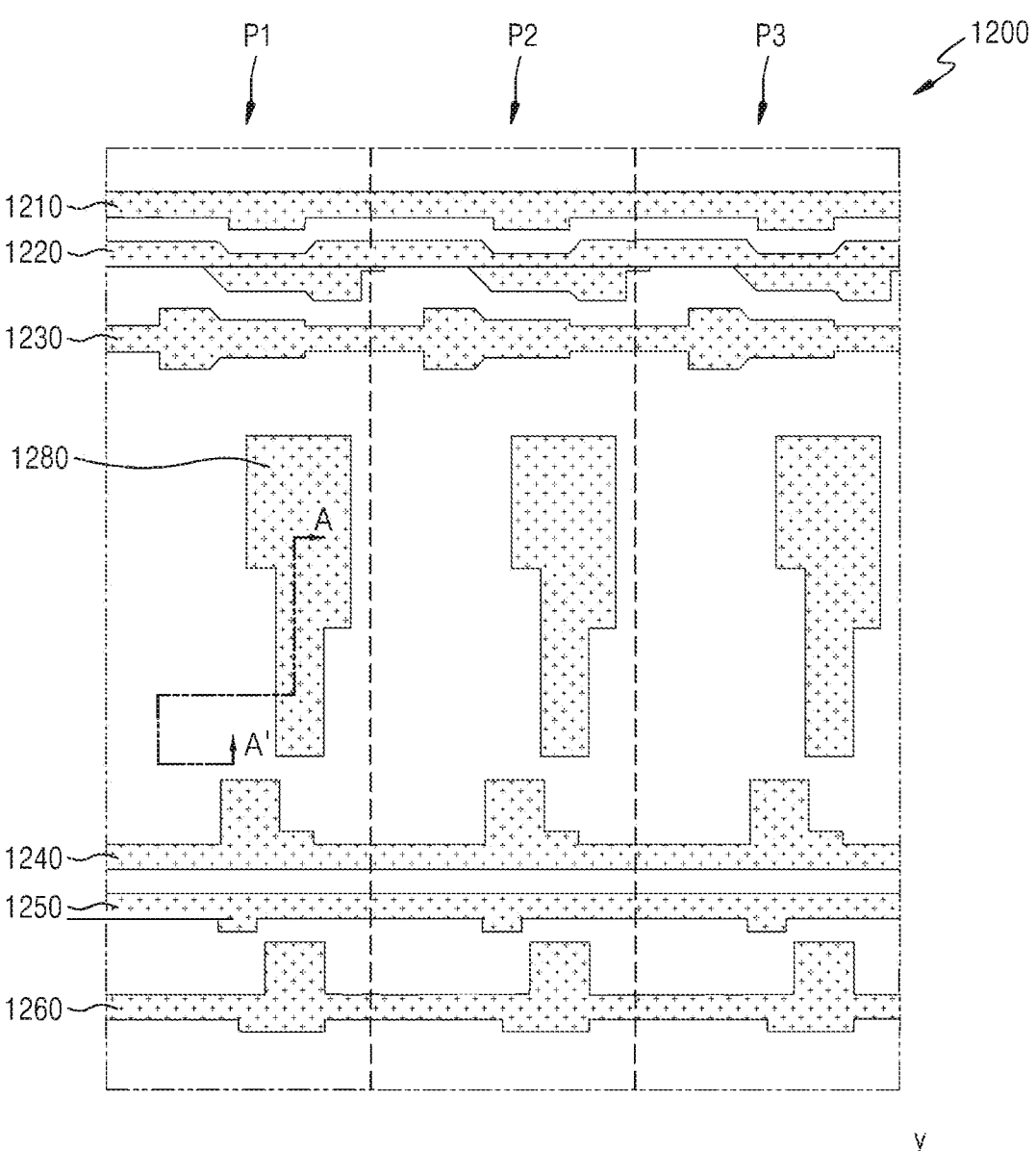
Figure 17:
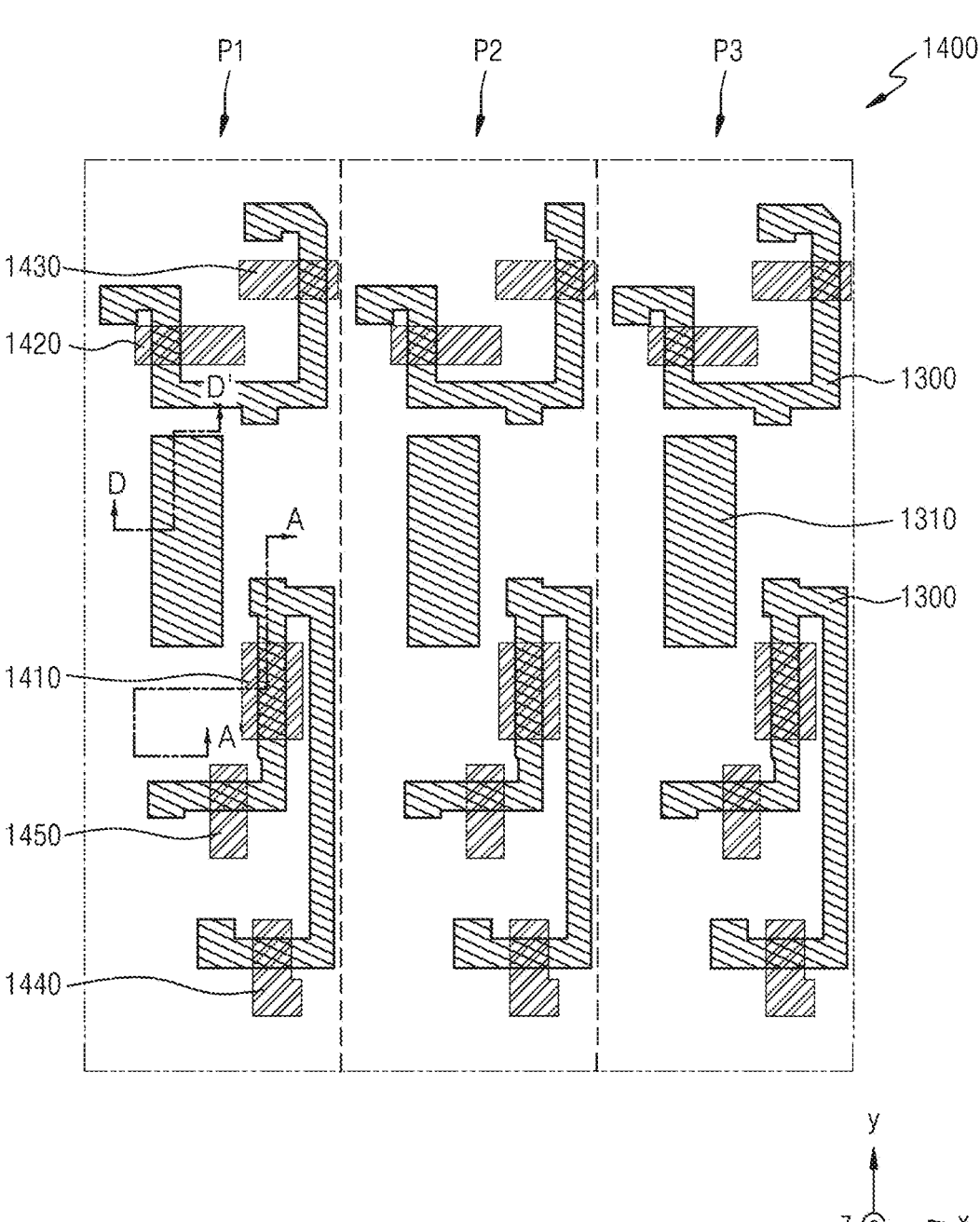
Figure 18:
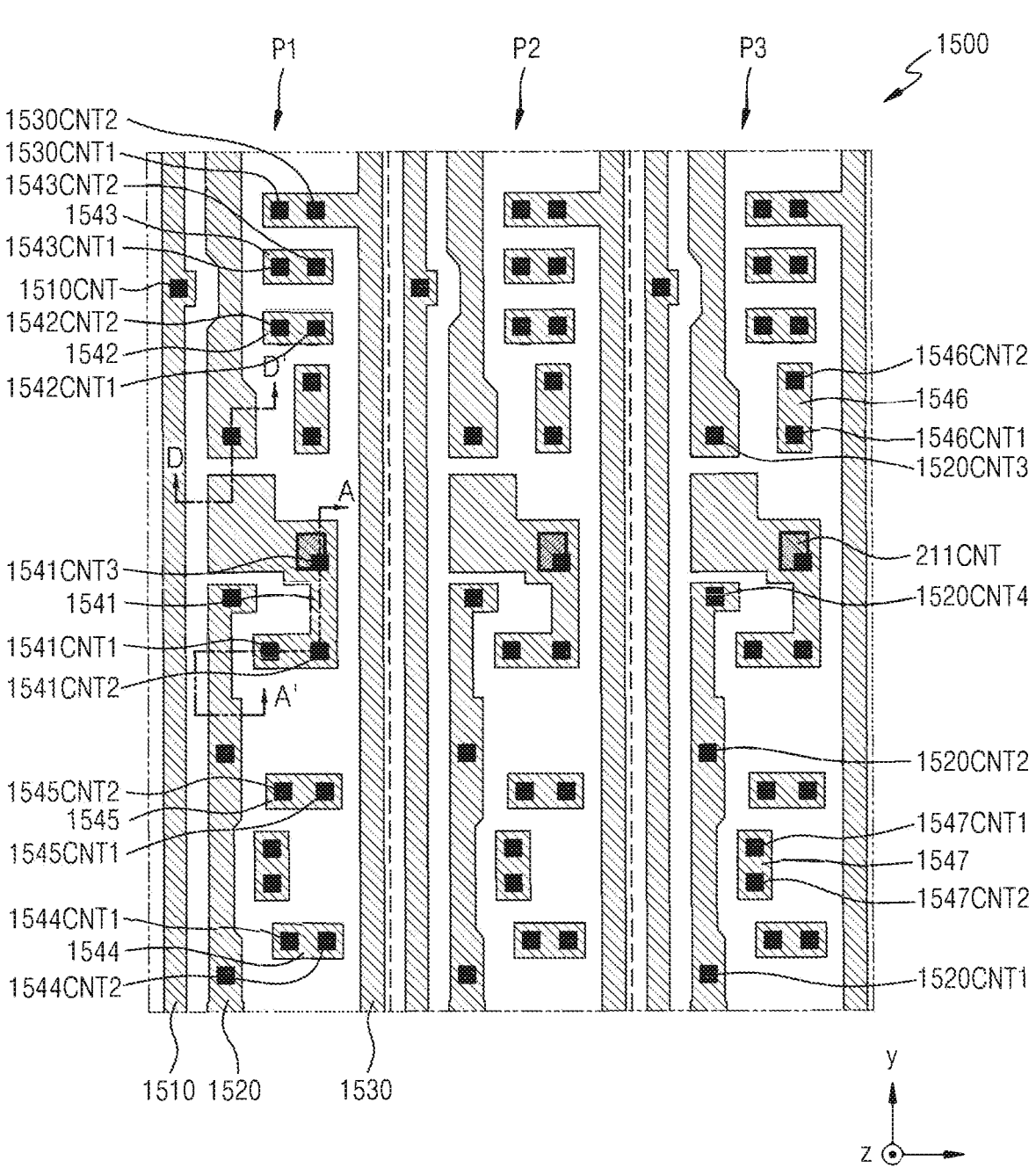
Figure 19:
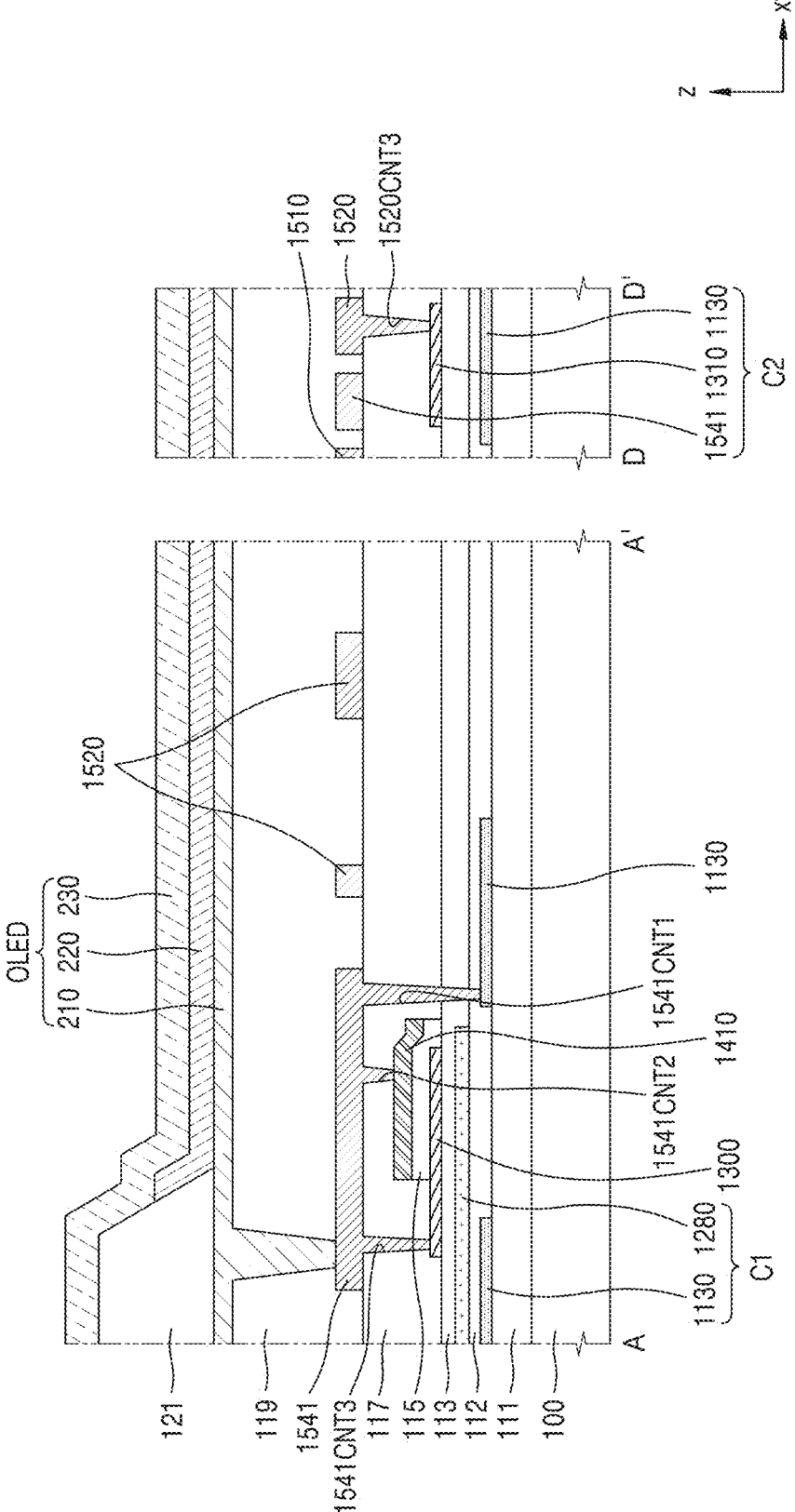
FIG. 19 is a cross-sectional view schematically illustrating cross-sections of the display apparatus taken along the lines A-A' and D-D' in FIGS. 15 to 18.

FIGS. 15 to 18 are plan views schematically illustrating layers included in a pixel of the display apparatus, according to one or more embodiments. In detail, FIG. 15 is a plan view schematically illustrating the first lower metal layer 1100, FIG. 16 is a plan view schematically illustrating the second lower metal layer 1200 disposed over the first lower metal layer 1100, FIG. 17 is a plan view schematically illustrating the semiconductor layer 1300 and the gate layer 1400, the semiconductor layer 1300 being disposed over the second lower metal layer 1200, and the gate layer 1400 being disposed over the semiconductor layer 1300, and FIG. 18 is a plan view schematically illustrating the source/drain layer 1500 disposed over the gate layer 1400. In addition, FIG. 19 is a cross-sectional view schematically illustrating cross-sections of the display apparatus taken along the lines A-A' and D-D' in FIGS. 15 to 18.

The first lower metal layer 1100 of FIG. 15 is the same as the first lower metal layer 1100 of the display apparatus according to the embodiment described above with reference to FIG. 5, except that the shape of the first capacitor electrode 1130 is changed. In FIG. 5, the first capacitor electrode 1130 includes the first portion 1131 and the second portion 1132 that are connected to each other. However, in FIG. 15, the first portion 1131 of FIG. 5 is removed, and instead, the second portion 1132 of FIG. 5 has a shape that is expanded in the direction in which the first portion 1131 is arranged in FIG. 5.

The second lower metal layer 1200 of FIG. 16 is the same as the second lower metal layer 1200 of the display apparatus according to the embodiment described above with reference to FIG. 6, except that the second capacitor electrode 1270 is removed, and the shape of the third capacitor electrode 1280 is changed. In FIG. 16, the width of the third capacitor electrode 1280 of FIG. 6 is decreased in a direction opposite to the direction in which the second capacitor electrode 1270 is arranged in FIG. 6. Accordingly, a portion of the first capacitor electrode 1130 of the first lower metal layer 1100 overlaps the third capacitor electrode 1280 to form the first capacitor C1, and the area of a portion in which the first capacitor electrode 1130 does not overlap the third capacitor electrode 1280 may also be secured significantly.

The semiconductor layer 1300 of FIG. 17 further includes the fourth capacitor electrode 1310, in addition to the semiconductor layer 1300 of the display apparatus according to the embodiment described above with reference to FIGS. 7 and 8. When forming a portion of the semiconductor layer 1300 except the fourth capacitor electrode 1310, the fourth capacitor electrode 1310 may be formed concurrently (e.g., simultaneously) with and of the same material as the portion of the semiconductor layer 1300. Accordingly, the fourth capacitor electrode 1310 may include an oxide semiconductor. Through the method as described above, the fourth capacitor electrode 1310 may be doped with impurities as necessary, to have relatively higher conductivity than before being doped. The gate layer 1400 of FIG. 17 is substantially the same as the gate layer 1400 of the display apparatus according to the embodiment described above with reference to FIG. 8.

The source/drain layer 1500 of FIG. 18 has a structure in which the source/drain layer 1500 of the display apparatus according to the embodiment described above with reference to FIG. 9 is modified such that the power voltage line 1520 is disconnected, and the first connection electrode 1541 extends to the disconnected portion of the power voltage line 1520. A portion marked by line D-D' in FIGS. 18 and 19 indicates one end of the disconnected portion of the power voltage line 1520 as described above.

In addition, the position of the contact hole 1520CNT3 of the source/drain layer 1500 of FIG. 18 is different from the position of the contact hole 1520CNT3 of the source/drain layer 1500 of the display apparatus according to the embodiment described above with reference to FIG. 9. The contact hole 1520CNT3 of the source/drain layer 1500 of the display apparatus according to the embodiment described above with reference to FIG. 9 electrically connects the power voltage line 1520 to the second capacitor electrode 1270 of the second lower metal layer 1200 therebelow. However, in the case of the display apparatus according to the present embodiment, the second capacitor electrode 1270 does not exist as shown in FIG. 16. Accordingly, in the case of the display apparatus according to the present embodiment, the contact hole 1520CNT3 is arranged to electrically connect one side (in the +y direction) of the disconnected power voltage line 1520 to the fourth capacitor electrode 1310 therebelow. In addition, the source/drain layer 1500 of the display apparatus according to the present embodiment further includes a contact hole 1520CNT4 that is not included in the source/drain layer 1500 of the display apparatus according to the embodiment described above with reference to FIG. 9, such that the other side (in the −y direction) of the disconnected power voltage line 1520 is electrically connected to the fourth capacitor electrode 1310 therebelow via the contact hole 1520CNT4. As a result, one side portion and the other side portion of the disconnected power voltage line 1520 are electrically connected to each other via the fourth capacitor electrode 1310.

For reference, other portions of the source/drain layer 1500 may be the same as corresponding portions of the source/drain layer 1500 of the display apparatus according to the embodiment described above with reference to FIG. 9.

In the case of the display apparatus according to the present embodiment, similar to the display apparatus according to the embodiment described above with reference to FIG. 10, the first capacitor C1 is formed by the first capacitor electrode 1130 of the first lower metal layer 1100 and the third capacitor electrode 1280 of the second lower metal layer 1200, the third capacitor electrode 1280 being disposed over the first capacitor electrode 1130 to overlap the first capacitor electrode 1130. However, the second capacitor C2 of the display apparatus according to the present embodiment is different from the second capacitor C2 of the display apparatus according to the embodiment described above with reference to FIG. 10.

As shown in the portion marked by line D-D' in FIG. 19, the second capacitor C2 is formed by the first capacitor electrode 1130 of the first lower metal layer 1100, the fourth capacitor electrode 1310 which is a portion of the semiconductor layer 1300 over the first capacitor electrode 1130 and overlaps the first capacitor electrode 1130, and first connection electrode 1541 which is a portion of the source/drain layer 1500 over the fourth capacitor electrode 1310 and is electrically connected to the first capacitor electrode 1130. The first connection electrode 1541 is electrically connected to the first capacitor electrode 1130 via the contact hole 1541CNT1, and the fourth capacitor electrode 1310 is electrically connected to the power voltage line 1520 arranged on the layer on which the first connection electrode 1541 is disposed, via the contact hole 1520CNT3. Accordingly, it may be considered that a capacitor formed by the first capacitor electrode 1130 and the fourth capacitor electrode 1310 is connected in parallel with a capacitor formed by the first connection electrode 1541 and the fourth capacitor electrode 1310. When the capacitors are connected in parallel with each other, the total capacitance is the sum of the capacitances of the respective capacitors. Accordingly, the capacitance of the second capacitor C2 formed by the first capacitor electrode 1130, the fourth capacitor electrode 1310, and the first connection electrode 1541 may be significantly increased, without expanding the area of the second capacitor C2 in a plan view. For reference, because the first connection electrode 1541 extends to the disconnected portion of the power voltage line 1520 as described above, a sufficient overlapping area between the first connection electrode 1541 and the fourth capacitor electrode 1310 may be secured.

Figure 20:
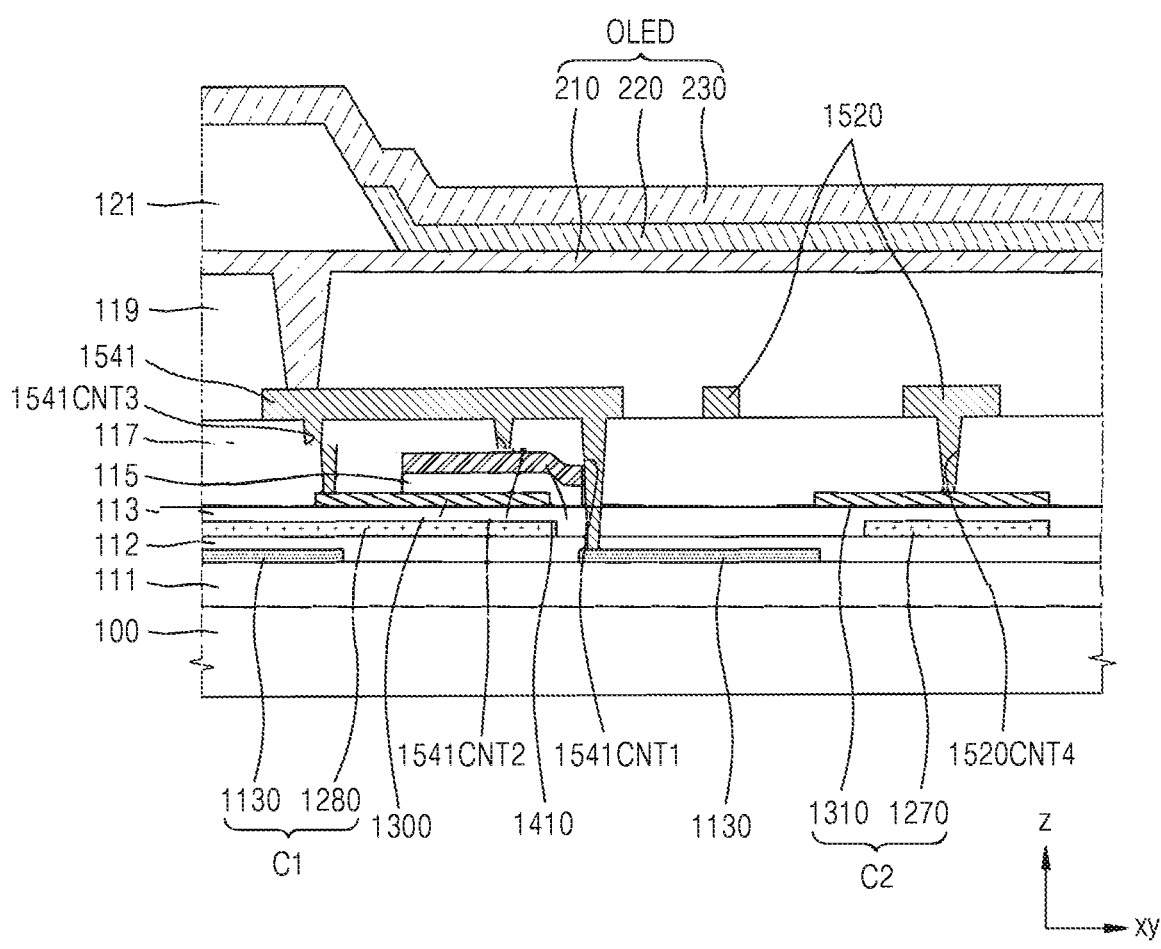
FIG. 20 is a cross-sectional view schematically illustrating a portion of a pixel of a display apparatus, according to one or more embodiments.

FIG. 20 is a cross-sectional view schematically illustrating a portion of a pixel of the display apparatus, according to one or more embodiments.

The display apparatus according to the present embodiment is different from the display apparatus according to the embodiment described above with reference to FIG. 19 in terms of the formation structure of the second capacitor C2. As shown in FIG. 20, the second lower metal layer 1200 may include the second capacitor electrode 1270, and the fourth capacitor electrode 1310 of the semiconductor layer 1300 may be disposed over the second capacitor electrode 1270 to overlap the second capacitor electrode 1270. In addition, the fourth capacitor electrode 1310 may be electrically connected to the power voltage line 1520 via the contact hole 1520CNT4, the power voltage line 1520 being disposed over the fourth capacitor electrode 1310 and disposed on the layer on which the first connection electrode 1541 is disposed.

In the case of the display apparatus according to the present embodiment, the second capacitor C2 is formed by the second capacitor electrode 1270 of the second lower metal layer 1200 and the fourth capacitor electrode 1310 of the semiconductor layer 1300. Only the third buffer layer 113 which is an inorganic insulating layer including an inorganic insulating material, such as silicon oxide, silicon nitride, silicon oxynitride, or aluminum oxide, is interposed between the second capacitor electrode 1270 and the fourth capacitor electrode 1310 which includes an oxide semiconductor.

The inorganic insulating layer has a smaller thickness than an organic insulating layer, and has a relatively high dielectric constant. Accordingly, the capacitance of the second capacitor C2 may be significantly increased through the configuration described above. When implementing a high-resolution display apparatus, the area of the capacitor in a plan view is inevitably reduced. However, in the case of the display apparatus according to the present embodiment, through the configuration as described above, the capacitance of the second capacitor C2 may be maintained sufficiently high while implementing a high-resolution display apparatus. Similarly, in the case of the first capacitor C1 formed by the first capacitor electrode 1130 of the first lower metal layer 1100 and the third capacitor electrode 1280 of the second lower metal layer 1200, because only the second buffer layer 112 which is an inorganic insulating layer is interposed between the first capacitor electrode 1130 and the third capacitor electrode 1280, the capacitance of the first capacitor C1 may be significantly increased.

For reference, the configurations of the first connection electrode 1541 and the pixel electrode 210 electrically connected to the first connection electrode 1541 may be the same as those described in connection with the display apparatus according to the embodiment described above, the first connection electrode 1541 being electrically connected to the first gate electrode 1410 via the contact hole 1541CNT2, to the first capacitor electrode 1130 via the contact hole 1541CNT1, and to the semiconductor layer 1300 via the contact hole 1541CNT3.

According to the one or more embodiments as described above, a display apparatus in which a high-quality image may be displayed may be implemented. However, the scope of the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a first capacitor electrode;
   a second capacitor electrode over the first capacitor electrode and overlapping the first capacitor electrode;
   a power voltage line over the second capacitor electrode and electrically connected to the second capacitor electrode;
   a connection electrode at a same layer as the power voltage line, the connection electrode being electrically connected to the first capacitor electrode; and
   a pixel electrode over the connection electrode and electrically connected to the connection electrode,
   a semiconductor layer on an insulating layer covering the second capacitor electrode; and
   a gate electrode over the semiconductor layer,
   wherein the first capacitor electrode is electrically connected to the gate electrode via the connection electrode.

2. The display apparatus of claim 1,
   wherein the power voltage line and the connection electrode are on an insulating layer covering the gate electrode.

3. The display apparatus of claim 2, wherein the semiconductor layer comprises an oxide semiconductor.

4. The display apparatus of claim 2, wherein the connection electrode is electrically connected to the gate electrode and the semiconductor layer.

5. The display apparatus of claim 1, further comprising a third capacitor electrode over the first capacitor electrode and overlapping the first capacitor electrode and located at a same layer as the second capacitor electrode, the third capacitor electrode being spaced from the second capacitor electrode.

6. The display apparatus of claim 1, further comprising a fourth capacitor electrode over the second capacitor electrode, overlapping the second capacitor electrode, and electrically connected to the connection electrode.

7. The display apparatus of claim 6,
   wherein the power voltage line and the connection electrode are on an insulating layer covering the gate electrode, and
   the fourth capacitor electrode and the semiconductor layer are integrally formed as a single body.

8. The display apparatus of claim 7, wherein the semiconductor layer comprises an oxide semiconductor.

9. The display apparatus of claim 1, further comprising a fourth capacitor electrode interposed between the second capacitor electrode and the power voltage line and electrically connected to the connection electrode, wherein a portion of the fourth capacitor electrode overlaps the second capacitor electrode and another portion of the fourth capacitor electrode overlaps the power voltage line.

10. The display apparatus of claim 9, wherein the power voltage line and the connection electrode are on an insulating layer covering the gate electrode, and wherein the fourth capacitor electrode and the semiconductor layer are integrally formed as a single body.

11. The display apparatus of claim 10, wherein the semiconductor layer comprises an oxide semiconductor.

12. A display apparatus comprising:

a first capacitor electrode;

a third capacitor electrode over the first capacitor electrode and overlapping the first capacitor electrode;

a semiconductor layer on an insulating layer covering the third capacitor electrode;

a fourth capacitor electrode at a same layer as the semiconductor layer, the fourth capacitor electrode being spaced from the semiconductor layer and overlapping the first capacitor electrode;

a gate electrode over the semiconductor layer;

a power voltage line over the fourth capacitor electrode and electrically connected to the fourth capacitor electrode;

a connection electrode over the gate electrode and at a same layer as the power voltage line, the connection electrode being electrically connected to the first capacitor electrode; and a pixel electrode over the connection electrode and electrically connected to the connection electrode, wherein the first capacitor electrode is electrically connected to the gate electrode via the connection electrode.

13. The display apparatus of claim 12, wherein the fourth capacitor electrode comprises a same material as a material of the semiconductor layer.

14. The display apparatus of claim 12, wherein each of the semiconductor layer and the fourth capacitor electrode comprises an oxide semiconductor.

15. The display apparatus of claim 12, wherein the power voltage line and the connection electrode are on an insulating layer covering the gate electrode.

16. The display apparatus of claim 15, wherein the connection electrode is electrically connected to the gate electrode and the semiconductor layer.

17. A display apparatus comprising:

a first capacitor electrode;

a third capacitor electrode over the first capacitor electrode to overlap the first capacitor electrode;

a second capacitor electrode at a same layer as the third capacitor electrode, the second capacitor electrode being spaced from the third capacitor electrode;

a semiconductor layer on an insulating layer covering the third capacitor electrode;

a fourth capacitor electrode at a same layer as the semiconductor layer, the fourth capacitor electrode being spaced from the semiconductor layer and overlapping the second capacitor electrode;

a gate electrode over the semiconductor layer:

a power voltage line over the fourth capacitor electrode and electrically connected to the fourth capacitor electrode;

a connection electrode over the gate electrode and at a same layer as the power voltage line, the connection electrode being electrically connected to the first capacitor electrode; and a pixel electrode over the connection electrode and electrically connected to the connection electrode, wherein the first capacitor electrode is electrically connected to the gate electrode via the connection electrode.

18. The display apparatus of claim 17, wherein the fourth capacitor electrode comprises a same material as a material of the semiconductor layer.

19. The display apparatus of claim 17, wherein each of the semiconductor layer and the fourth capacitor electrode comprises an oxide semiconductor.

20. The display apparatus of claim 17, wherein the power voltage line and the connection electrode are on an insulating layer covering the gate electrode.

21. The display apparatus of claim 20, wherein the connection electrode is electrically connected to the gate electrode and the semiconductor layer.

* * * * *